US010876205B2

(12) United States Patent
Verghese et al.

(10) Patent No.: US 10,876,205 B2
(45) Date of Patent: Dec. 29, 2020

(54) REACTANT VAPORIZER AND RELATED SYSTEMS AND METHODS

(71) Applicant: ASM IP Holding B.V., Almere (NL)

(72) Inventors: Mohith Verghese, Phoenix, AZ (US);
Eric James Shero, Phoenix, AZ (US);
Carl Louis White, Gilbert, AZ (US);
Kyle Fondurulia, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 273 days.

(21) Appl. No.: 15/283,120

(22) Filed: Sep. 30, 2016

(65) Prior Publication Data

US 2018/0094350 A1 Apr. 5, 2018

(51) Int. Cl.
*C23C 16/00* (2006.01)
*C23C 16/448* (2006.01)

(52) U.S. Cl.
CPC .................................. *C23C 16/4481* (2013.01)

(58) Field of Classification Search
CPC ................................................... C23C 14/243
See application file for complete search history.

(56) References Cited

U.S. PATENT DOCUMENTS

| | | | |
|---|---|---|---|
| 3,587,620 A * | 6/1971 | Berthold | C23C 16/4481 118/725 |
| 4,393,013 A | 7/1983 | McMenhmin | |
| 4,436,674 A | 3/1984 | McMenhmin | |
| 4,560,462 A | 12/1985 | Radford | |
| 4,722,298 A | 2/1988 | Rubin et al. | |
| 4,883,362 A | 11/1989 | Gartner et al. | |
| 4,947,790 A | 8/1990 | Gartner et al. | |
| 5,071,553 A | 12/1991 | Newlin | |
| 5,121,707 A | 6/1992 | Kanoo | |
| 5,199,603 A | 4/1993 | Prescott | |
| 5,377,429 A | 1/1995 | Sandhu | |
| 5,380,367 A | 1/1995 | Bertone | |

(Continued)

FOREIGN PATENT DOCUMENTS

| | | |
|---|---|---|
| GB | 2 151 662 | 7/1985 |
| JP | S64-064314 | 3/1989 |

(Continued)

OTHER PUBLICATIONS

English translation JP 11168092, Mizutani, Jun. 1999 (Year: 1999).*

(Continued)

*Primary Examiner* — Keath T Chen
(74) *Attorney, Agent, or Firm* — Knobbe, Martens, Olson & Bear, LLP

(57) ABSTRACT

Herein disclosed are systems and methods related to solid source chemical vaporizer vessels and multiple chamber deposition modules. In some embodiments, a solid source chemical vaporizer includes a housing base and a housing lid. Some embodiments also include a first and second tray configured to be housed within the housing base, wherein each tray defines a first serpentine path adapted to hold solid source chemical and allow gas flow thereover. In some embodiments, a multiple chamber deposition module includes first and second vapor phase reaction chambers and a solid source chemical vaporizer vessel to supply each of the first and second vapor phase reaction chambers.

19 Claims, 19 Drawing Sheets

(56) References Cited

U.S. PATENT DOCUMENTS

| | | | |
|---|---|---|---|
| 5,562,132 A * | 10/1996 | Siegele | B01J 4/00 |
| | | | 137/209 |
| 5,567,127 A | 10/1996 | Wentz | |
| 5,667,682 A | 9/1997 | Laird | |
| 5,709,753 A | 1/1998 | Olson | |
| 5,732,744 A | 3/1998 | Barr et al. | |
| 5,795,628 A | 8/1998 | Wisard | |
| 5,803,165 A | 9/1998 | Shikazono | |
| 5,836,483 A | 11/1998 | Disel | |
| 5,876,503 A | 3/1999 | Roeder | |
| 5,904,771 A | 5/1999 | Tasaki et al. | |
| 6,083,321 A | 7/2000 | Lei et al. | |
| 6,116,257 A | 9/2000 | Yokota | |
| 6,221,306 B1 | 4/2001 | Johnson | |
| 6,270,839 B1 | 8/2001 | Onoe et al. | |
| 6,312,525 B1 | 11/2001 | Bright et al. | |
| 6,365,229 B1 * | 4/2002 | Robbins | B05D 1/60 |
| | | | 118/715 |
| 6,422,830 B1 | 7/2002 | Yamada | |
| 6,444,043 B1 | 9/2002 | Gegenwart | |
| 6,718,126 B2 | 4/2004 | Lei | |
| 6,849,832 B2 | 2/2005 | Endo | |
| 6,889,864 B2 | 5/2005 | Lindfors et al. | |
| 6,905,541 B2 | 6/2005 | Chen et al. | |
| 6,909,839 B2 | 6/2005 | Wang et al. | |
| 6,946,034 B1 | 9/2005 | Bruce | |
| 7,018,478 B2 | 3/2006 | Lindfors et al. | |
| 7,186,385 B2 | 3/2007 | Ganguli et al. | |
| 7,270,709 B2 | 9/2007 | Chen et al. | |
| 7,278,887 B1 | 10/2007 | Palinkas | |
| 7,413,767 B2 | 8/2008 | Bauch | |
| 7,437,060 B2 | 10/2008 | Wang et al. | |
| 7,531,090 B1 | 5/2009 | Stamey | |
| 7,730,747 B2 | 6/2010 | Galante | |
| 7,815,737 B2 | 10/2010 | Kim | |
| 7,833,353 B2 | 11/2010 | Furukawahara et al. | |
| 8,137,462 B2 | 3/2012 | Fondurulia et al. | |
| 8,357,241 B2 | 1/2013 | Matsumoto | |
| 8,986,456 B2 | 3/2015 | Fondurulia | |
| 9,593,416 B2 | 3/2017 | Fondurulia et al. | |
| 2001/0003603 A1 | 6/2001 | Eguchi et al. | |
| 2002/0108670 A1 | 8/2002 | Baker et al. | |
| 2002/0134760 A1 | 9/2002 | Rehrig | |
| 2003/0054100 A1 | 3/2003 | Eser | |
| 2004/0000270 A1 | 1/2004 | Carpenter | |
| 2004/0013577 A1 | 1/2004 | Ganguli | |
| 2004/0016404 A1 | 1/2004 | Gregg et al. | |
| 2004/0159005 A1 | 8/2004 | Olander | |
| 2005/0000428 A1 | 1/2005 | Shero et al. | |
| 2005/0006799 A1 | 1/2005 | Gregg | |
| 2005/0019026 A1 | 1/2005 | Wang et al. | |
| 2005/0019028 A1 | 1/2005 | Wang et al. | |
| 2005/0039794 A1 | 2/2005 | Birtcher | |
| 2005/0066893 A1 | 3/2005 | Soinenen | |
| 2005/0072357 A1 | 4/2005 | Shero et al. | |
| 2005/0167981 A1 | 8/2005 | Nuttall | |
| 2005/0211172 A1 | 9/2005 | Freeman | |
| 2005/0263075 A1 | 12/2005 | Wang et al. | |
| 2006/0112882 A1 | 6/2006 | Suzuki | |
| 2006/0112883 A1 * | 6/2006 | Suzuki | C23C 16/16 |
| | | | 118/726 |
| 2006/0115593 A1 | 6/2006 | Suzuki | |
| 2006/0133955 A1 | 6/2006 | Peters | |
| 2006/0185597 A1 | 8/2006 | Suzuki | |
| 2006/0185598 A1 | 8/2006 | Suzuki | |
| 2007/0101940 A1 | 5/2007 | Iizuka | |
| 2007/0235085 A1 | 10/2007 | Nakashima | |
| 2008/0047890 A1 | 2/2008 | Klein | |
| 2008/0085226 A1 | 4/2008 | Fondurulia et al. | |
| 2008/0149031 A1 | 6/2008 | Chu et al. | |
| 2009/0087545 A1 | 4/2009 | Ohmi | |
| 2009/0107401 A1 * | 4/2009 | Reinhold | C23C 14/228 |
| | | | 118/726 |
| 2009/0114157 A1 | 5/2009 | Lee | |
| 2009/0136668 A1 | 5/2009 | Gregg et al. | |
| 2010/0065481 A1 | 3/2010 | Formica | |
| 2010/0242835 A1 | 9/2010 | Arena | |
| 2010/0255198 A1 | 10/2010 | Cleary | |
| 2010/0322604 A1 | 12/2010 | Fondurulia et al. | |
| 2011/0033618 A1 * | 2/2011 | Noll | C23C 16/45561 |
| | | | 427/248.1 |
| 2011/0226624 A1 * | 9/2011 | Dorrer | B03C 5/005 |
| | | | 204/547 |
| 2012/0156108 A1 | 6/2012 | Fondurulia et al. | |
| 2014/0329025 A1 | 11/2014 | Cleary | |
| 2015/0170909 A1 * | 6/2015 | Sato | H01L 21/02274 |
| | | | 438/778 |
| 2017/0250625 A1 * | 8/2017 | Fan | B81B 5/00 |
| 2018/0094351 A1 | 4/2018 | Verghese et al. | |

FOREIGN PATENT DOCUMENTS

| | | |
|---|---|---|
| JP | H01-265511 | 10/1989 |
| JP | H09-040489 | 2/1997 |
| JP | H11-168092 | 6/1999 |
| WO | WO 2004/106584 | 12/2004 |
| WO | WO 2007/057631 | 5/2007 |

OTHER PUBLICATIONS

Partial International Search Report on claims 1-9 from the International Searching Authority dated Apr. 15, 2008, in corresponding International Patent Application No. PCT/US2007/081005.

Office Action dated Sep. 27, 2013 in Korean Application No. 10-2009-7009467 with English Translation.

Notice of Reasons for Rejection dated Mar. 27, 2012 for Japanese Patent Application No. 2009-532567, filed Oct. 10, 2007.

Office Action dated Jun. 23, 2011 in U.S. Appl. No. 11/870,374.

Final Office Action dated Oct. 18, 2011 in U.S. Appl. No. 11/870,374.

Final Office Action dated Nov. 23, 2011 in U.S. Appl. No. 11/870,374.

Office Action dated Jan. 21, 2015 in U.S. Appl. No. 13/404,700.

Final Office Action dated Sep. 10, 2015 in U.S. Appl. No. 13/404,700.

Office Action dated May 16, 2016 in U.S. Appl. No. 13/404,700.

Final Office Action dated Oct. 5, 2016 in U.S. Appl. No. 13/404,700.

* cited by examiner

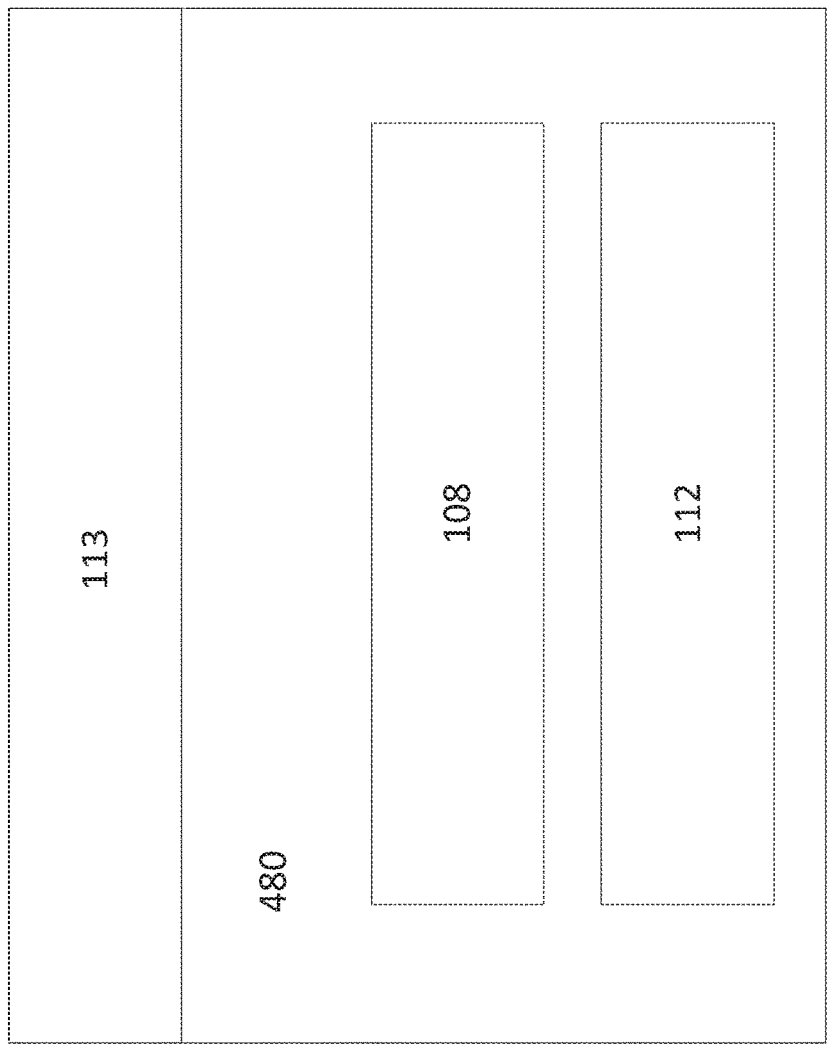

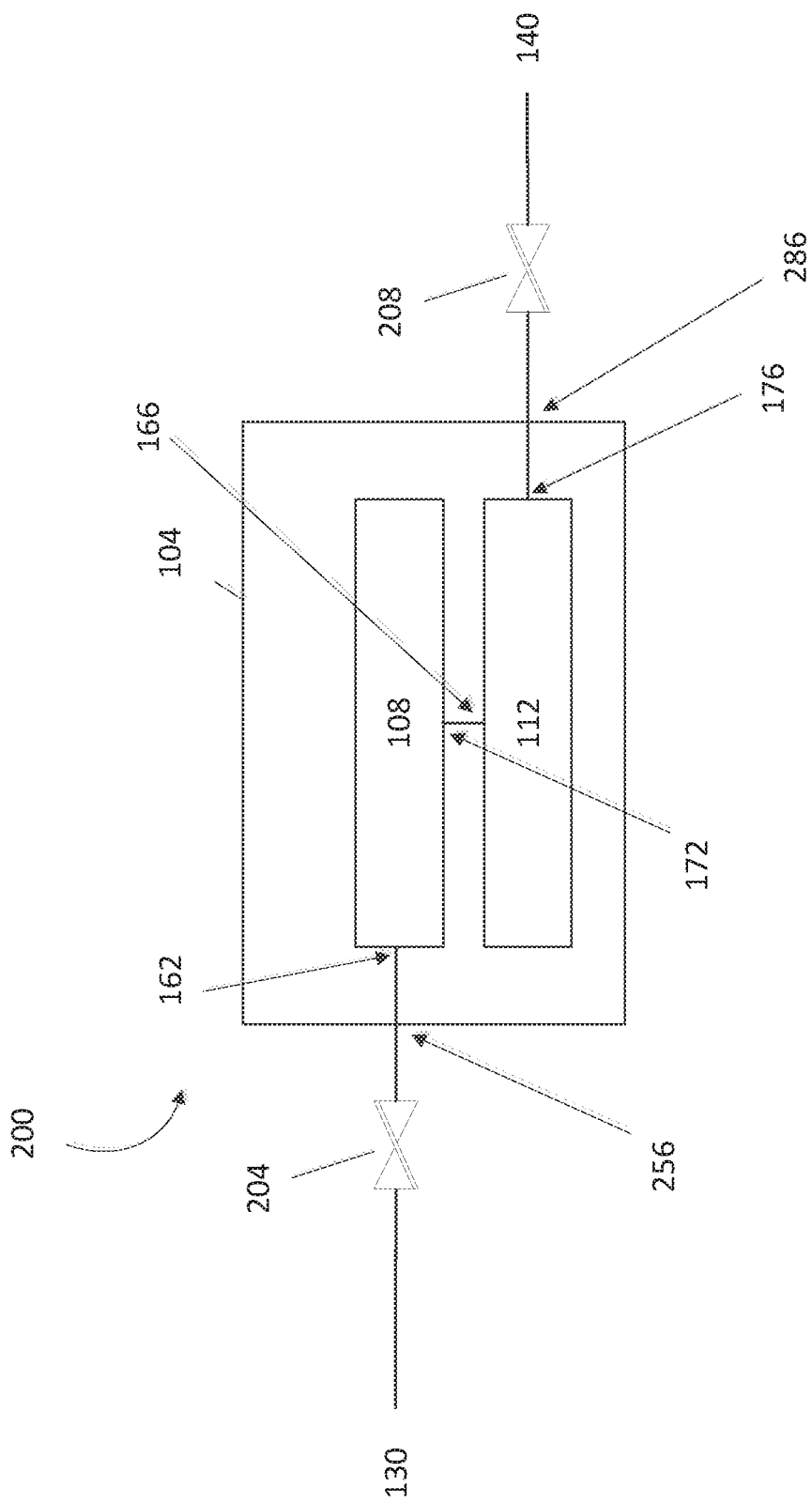

REACTANT VAPORIZER AND RELATED SYSTEMS AND METHODS

BACKGROUND

Field

The present application relates generally to systems and methods involving semiconductor processing equipment and specifically to vaporizing systems for chemical vapor delivery.

Description of the Related Art

A typical solid or liquid source reactant delivery system includes a solid or liquid source vessel and a heating means (e.g., radiant heat lamps, resistive heaters, etc.). The vessel includes the solid (e.g., in powder form) or liquid source precursor. The heating means heats up the vessel to vaporize the reactant in the vessel. The vessel has an inlet and an outlet for the flow of an inert carrier gas (e.g., $N_2$) through the vessel. The carrier gas sweeps reactant vapor along with it through the vessel outlet and ultimately to a substrate reaction chamber. The vessel typically includes isolation valves for fluidly isolating the contents of the vessel from the vessel exterior. Ordinarily, one isolation valve is provided upstream of the vessel inlet, and another isolation valve is provided downstream of the vessel outlet.

SUMMARY

In one aspect, a solid source chemical vaporizer is provided. The vaporizer can include a housing base, a first tray that is configured to be housed within the housing base such that the first tray defines a first serpentine path adapted to hold solid source chemical and allow gas flow thereover, a second tray that is configured to be housed within the housing base vertically adjacent the first tray such that the second tray defines a second serpentine path adapted to hold solid source chemical and allow gas flow thereover, and a housing lid.

In some embodiments, the first serpentine path and the second serpentine path are fluidly connected in series. In other embodiments, the first serpentine path and the second serpentine path are fluidly connected in parallel. In such embodiments, the first serpentine path and the second serpentine path can be not in fluid communication with each other within the solid source chemical vaporizer.

The first and second serpentine paths can each include a recess formed in a solid metal block. Each of the recesses can define a height: width aspect ratio in a range of about 1.5-5.

In some embodiments, the housing lid includes a first inlet valve mounted on the lid and in fluid communication with the first serpentine path, a first outlet valve mounted on the lid and in fluid communication with the first serpentine path, a second inlet valve mounted on the lid and in fluid communication with the second serpentine path, and a second outlet valve mounted on the lid and in fluid communication with the second serpentine path.

The housing lid can further include a vent valve mounted on the lid and in fluid communication with each of the first and second serpentine paths.

In another aspect, a solid source chemical vaporizer includes a housing base, a first tray configured to be housed within the housing base such that the first tray defines a first path adapted to hold solid source chemical and allow gas flow thereover, and a second tray configured to be housed within the housing base vertically adjacent the first tray. The second tray defines a second path adapted to hold solid source chemical and allow gas flow thereover. The vaporizer also includes a housing lid, a first inlet valve mounted on the housing lid and in fluid communication with the first path, a first outlet valve mounted on the housing lid and in fluid communication with the first path, a second inlet valve mounted on the housing lid and in fluid communication with the second path, and a second outlet valve mounted on the housing lid and in fluid communication with the second path.

The housing lid can further include a vent valve mounted on the lid and in fluid communication with each of the first and second serpentine paths.

In some embodiments, the solid source chemical vaporizer defines a ratio of a volume (in $mm^3$) enclosed by the solid source chemical vaporizer to the total path length (in mm) of the first and second trays in a range of about 400-1200.

In another aspect, a multiple chamber deposition module is provided. The multiple chamber deposition module includes a first vapor phase reaction chamber for depositing a first material on a first substrate, a second vapor phase reaction chamber for depositing a second material on a second substrate, and a solid source chemical vaporizer connected to supply each of the first and second vapor phase reaction chambers.

In some embodiments, the solid source chemical vaporizer can include a first tray defining a first serpentine path such that the first serpentine path is adapted to hold solid source chemical and allow gas flow thereover, and a second tray defining a second serpentine path such that the second serpentine path is adapted to hold solid source chemical and allow gas flow thereover.

The solid source chemical vaporizer can further include a housing base, a housing lid, a first inlet valve mounted on the housing lid and in fluid communication with the first serpentine path, a first outlet valve mounted on the housing lid and in fluid communication with the first serpentine path, a second inlet valve mounted on the housing lid and in fluid communication with the second serpentine path, a second outlet valve mounted on the housing lid and in fluid communication with the second serpentine path, and a vent valve mounted and in fluid communication with each of the first and second serpentine paths. The first outlet valve and the second outlet valve can be in fluid communication at a connection point, and a carrier gas can selectively pass from a separation point into the first vapor phase reaction chamber and/or the second vapor phase reaction chamber. The module can also include a first gas panel valve fluidly interposed between the connection point and the separation point. The module can additionally include a first filter on the housing lid or in a wall of the housing base, where the first filter adapted to prevent solid particulate matter from flowing therethrough. The module can additionally include a heater plate vertically adjacent the solid source chemical vaporizer.

In some embodiments, the module additionally includes control processors and software configured to operate the first vapor phase reaction chamber to perform atomic layer deposition (ALD). In other embodiments, the module additionally includes control processors and software configured to operate the first vapor phase reaction chamber to perform chemical vapor deposition (CVD).

In some embodiments, the first serpentine path and the second serpentine path are fluidly connected in parallel. In such embodiments, the first serpentine path and the serpentine module path can fluidly communicate at a connection point fluidly interposed between the solid source chemical vaporizer and a separation point. The separation point can be disposed at an upper valve plate and can be fluidly interposed between the connection point and each of the first and second vapor phase reaction chambers.

In some embodiments, module additionally includes a heater plate vertically adjacent the solid source chemical vaporizer and a valve plate heater disposed above the housing lid. The heater plate and valve plate heater can be adapted to heat the housing base to an operating temperature in a range of about 50° C.-250° C.

In another aspect, a method for delivering vaporized precursor in a multiple chamber deposition module can include connecting a solid source chemical vaporizer to supply each of first and second vapor phase reaction chambers and heating the solid source chemical vaporizer to an operating temperature.

In some embodiments, the method additionally includes providing a first solid source chemical in a first serpentine path of a first tray and a second solid source chemical in a second serpentine path of a second tray. The first and second serpentine paths can be fluidly connected in parallel. In other arrangements, the first and second serpentine paths can be fluidly connected in series. The first and second serpentine paths can be arranged to not be in fluid communication with each other within the solid source chemical vaporizer.

In some embodiments, the method also includes passing a first inert gas over the first solid source chemical and a second inert gas over the second solid source chemical, depositing a first material on a first substrate in the first vapor phase reaction chamber, and depositing a second material on a second substrate in the second vapor phase reaction chamber. The first material can be different from the second material. Depositing the first material and depositing the second material can each include performing atomic layer deposition (ALD). Depositing the first material and depositing the second material can each include performing chemical vapor deposition (CVD).

BRIEF DESCRIPTION OF THE DRAWINGS

These and other aspects of the disclosure will be readily apparent to the skilled artisan in view of the description below, the appended claims, and from the drawings, which are intended to illustrate and not to limit the invention, and wherein:

FIG. 1A illustrates a schematic of some embodiments of solid source chemical vaporizer (SSCV) vessels.

FIG. 2C shows a fluid configuration of the trays of the vessel such that the flow paths through the trays are arranged in series.

DETAILED DESCRIPTION

Figure 1B:
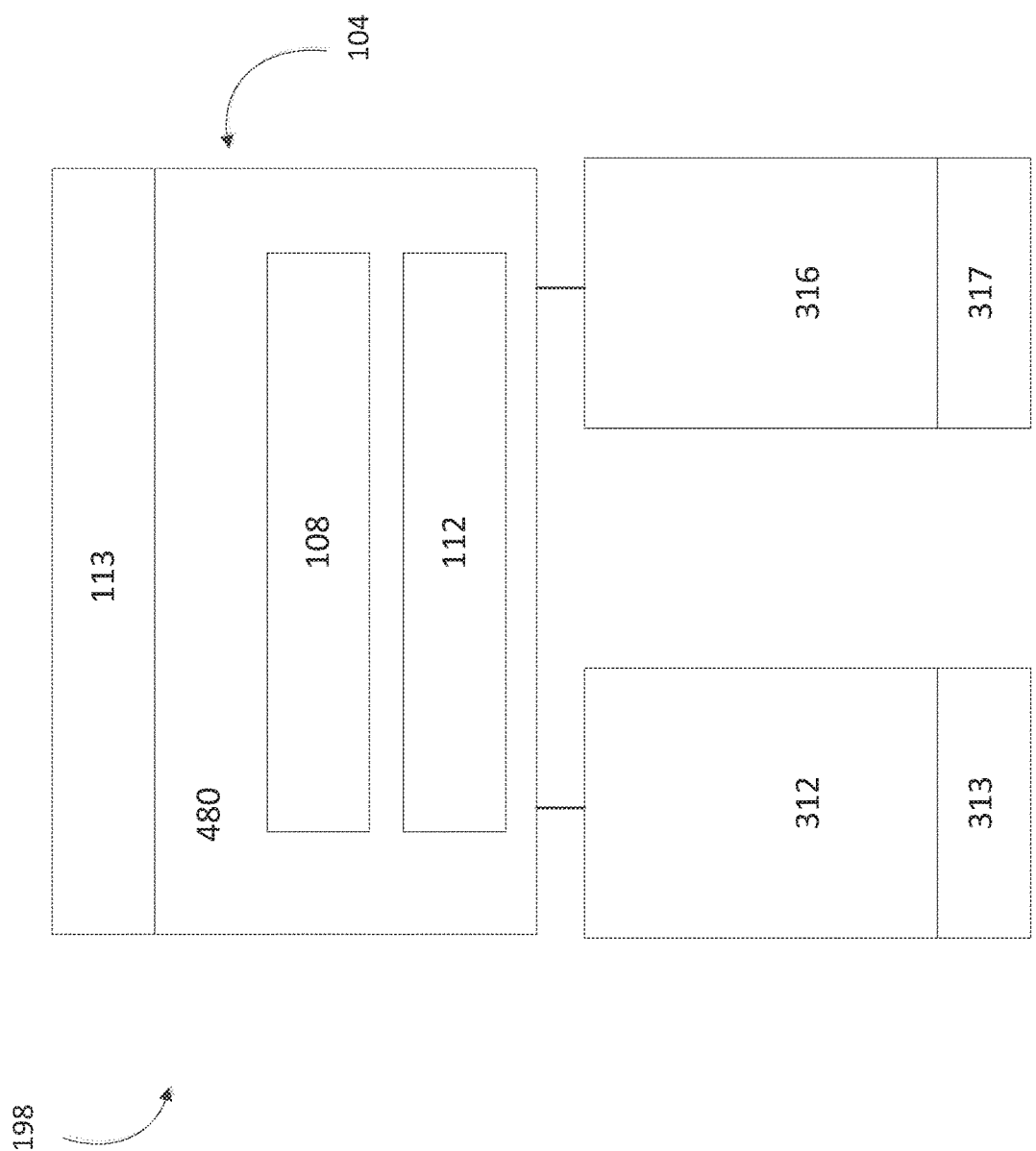
FIG. 1B shows schematically an embodiment of a multiple-chamber deposition module that includes a vessel supplying multiple deposition chambers.

The headings provided herein, if any, are for convenience only and do not necessarily affect the scope or meaning of the claimed invention.

Described herein are systems and related methodologies for delivering vaporized reactant in a multiple-chamber deposition module. This application further describes systems for vaporizing chemical solid source material and delivering reactant vapor that may be used in deposition modules comprising one or more deposition modules.

The following detailed description of the preferred embodiments and methods details certain specific embodiments to assist in understanding the claims. However, one may practice the present invention in a multitude of different embodiments and methods, as defined and covered by the claims.

Chemical vapor deposition (CVD) is a known process in the semiconductor industry for forming thin films of materials on substrates such as silicon wafers. In CVD, reactant vapors (including "precursor gases") of different reactant chemicals are delivered to one or more substrates in a reaction chamber. In many cases, the reaction chamber includes only a single substrate supported on a substrate holder (such as a susceptor), with the substrate and substrate holder being maintained at a desired process temperature. In typical CVD processes, mutually reactive reactant vapors react with one another to form thin films on the substrate, with the growth rate being related to the temperature and the amounts of reactant gases. In some variants, energy to drive the deposition reactants is supplied in whole or in part by plasma.

In some applications, the reactant gases are stored in gaseous form in a reactant source vessel. In such applications, the reactants are often gaseous at standard pressures and temperatures of around 1 atmosphere and room temperature. Examples of such gases include nitrogen, oxygen, hydrogen, and ammonia. However, in some cases, the vapors of source chemicals ("precursors") that are liquid or solid (e.g., hafnium chloride, hafnium oxide, zirconium dioxide, etc.) at standard pressure and temperature are used. For some solid substances (referred to herein as "solid source precursors"), the vapor pressure at room temperature is so low that they are typically heated and/or maintained at very low pressures to produce a sufficient amount of reactant vapor for the reaction process. Once vaporized, it is important that the vapor phase reactant is kept at or above the vaporizing temperature through the processing system so as to prevent undesirable condensation in the valves, filters, conduits, and other components associated with delivering the vapor phase reactants to the reaction chamber. Vapor phase reactants from such naturally solid or liquid substances are useful for chemical reactions in a variety of other industries.

Atomic layer deposition (ALD) is another known process for forming thin films on substrates. In many applications, ALD uses a solid and/or liquid source chemical as described above. ALD is a type of vapor deposition wherein a film is built up through self-saturating reactions performed in cycles. The thickness of the film is determined by the number of cycles performed. In an ALD process, gaseous reactants are supplied, alternatingly and/or repeatedly, to the substrate or wafer to form a thin film of material on the wafer. One reactant adsorbs in a self-limiting process on the wafer. A different, subsequently pulsed reactant reacts with the adsorbed material to form a single molecular layer of the desired material. Decomposition may occur through mutual reaction between the adsorbed species and with an appropriately selected reagent, such as in a ligand exchange or a gettering reaction. In a theoretical ALD reaction, no more than a molecular monolayer forms per cycle. Thicker films are produced through repeated growth cycles until the target thickness is achieved.

In theoretical ALD reactions, mutually reactive reactants are kept separate in the vapor phase with intervening removal processes between substrate exposures to different reactants. For example, in time-divided ALD processes, reactants are provided in pulses to a stationary substrate, typically separated by purging or pump down phases; in space-divided ALD processes, a substrate is moved through zones with different reactants; and in some processes aspects of both space-divided and time-divided ALD can be combined. The skilled artisan will appreciate that some variants or hybrid processes allow some amount of CVD-like reactions, either through selection of the deposition conditions outside the normal ALD parameter windows and/or through allowing some amount of overlap between mutually reactive reactants during exposure to the substrate.

Reactant source vessels are normally supplied with gas lines extending from the inlet and outlet, isolation valves on the lines, and fittings on the valves, the fittings being configured to connect to the gas flow lines of the remaining substrate processing apparatus. It is often desirable to provide a number of additional heaters for heating the various valves and gas flow lines between the reactant source vessel and the reaction chamber, to prevent the reactant vapor from condensing and depositing on such components. Accordingly, the gas-conveying components between the source vessel and the reaction chamber are sometimes referred to as a "hot zone" in which the temperature is maintained above the vaporization/condensation temperature of the reactant.

FIG. 1A illustrates a schematic of some embodiments of solid source chemical vaporizer (SSCV) vessels. A solid source precursor is a source chemical that is solid under standard conditions (i.e., room temperature and atmospheric pressure). In some embodiments, the vessel 104 can include a housing base 480, a housing lid 113, a first tray 108, and a second tray 112. The vessel 104 may include one or more trays, and FIG. 1A should not be viewed as limiting the number of trays the vessel 104 can contain, as described herein. In some embodiments, the lid 113 is adapted to be mechanically attached to the housing base 480. This may be done using one or more of attachment devices (e.g., bolts, screws, etc.). In certain embodiments, the lid 113 and the housing base 480 are mechanically attached in a gas-tight fashion.

In certain configurations, the trays 108, 112 are adapted to hold solid source chemical and allow the flow of gas thereover. In some embodiments, the second tray 112 is housed within the vessel vertically adjacent the first tray 108. In certain configurations, vertically adjacent includes being in physical contact. In some embodiments, adjacent includes being fluidly sealed such that vapor in one tray does not directly communicate with another tray, as described in further detail herein. In some embodiments, the second tray 112 is situated above the first tray 108. In some embodiments, the second tray 112 is situated below the first tray 108. In certain embodiments, the trays 108, 112 each define a serpentine path that is adapted to hold solid source chemical for a vapor deposition reaction.

FIG. 1B shows schematically how a multiple-chamber deposition module 198 can include a vessel 104 and two or more deposition chambers 312, 316. In some embodiments, the deposition chambers 312, 316 can be controlled using corresponding controllers 313, 317. In some embodiments, the controllers 313, 317 are configured to perform ALD, as described in more detail herein. In some embodiments, the controllers 313, 317 include processors and memory programmed to perform ALD. While shown as separately associated with deposition chambers, the skilled artisan will appreciate that a single controller or multiple controllers can govern the operation of both chambers, any heaters in the deposition module 198, pumps and/or valves to pumps for pressure control, robotic control for substrate handling, and valves for control of vapor flow, including carrier flow to and vapor flow from the solid source vessel 104. The module 198 may include more than two deposition chambers 312, 316, and FIG. 1B should not be viewed as limiting the number of deposition chambers 108, 112 the module 198 can contain, as described herein. In the illustrated embodiment, the deposition chambers 312, 316 are in fluid communication with the vessel, as described herein in more detail.

The illustrated SSCV vessel 104 and multiple-chamber deposition module 198 are particularly suited for delivering vapor phase reactants to be used in multiple vapor phase reaction chambers. The vapor phase reactants can be used for deposition (e.g., CVD) or Atomic Layer Deposition (ALD). In some embodiments, control processors and programming stored on computer-readable media are included such that the embodiments disclosed herein are configured to perform ALD. In certain embodiments, control processors and programming stored on computer-readable media are included such that the embodiments disclosed herein are configured to perform CVD.

Figure 2A:
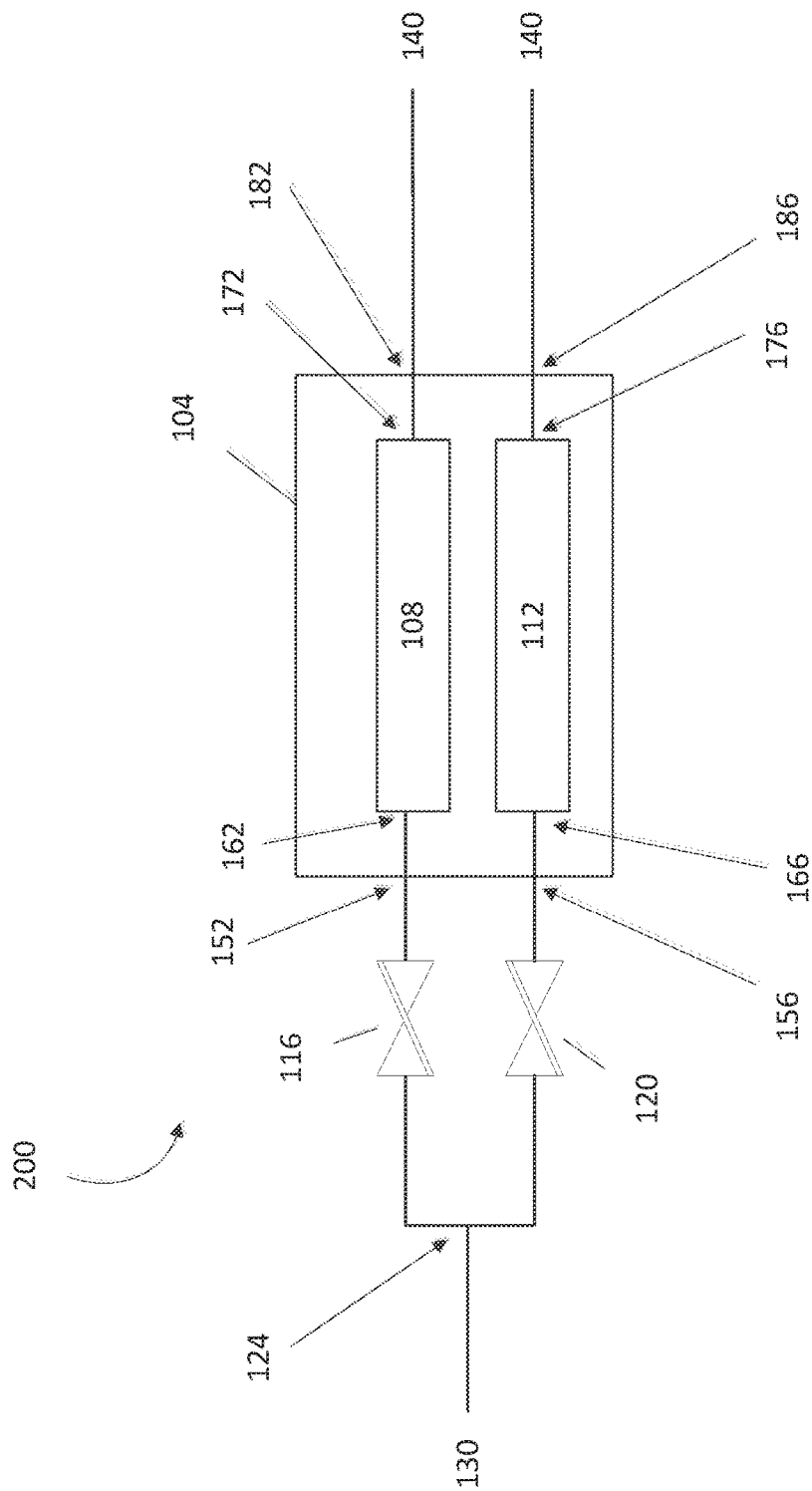
FIG. 2A shows a fluid configuration of the trays of the vessel such that the trays have separate flow paths within the vessel.

In some embodiments, a fluid configuration 200 of the trays 108, 112 of the vessel 104 is such that the trays form parts of flow paths that are separate from one another, e.g., are not in direct fluid communication with one another, within the vessel 104, as shown in FIG. 2A. Inlet flow of a carrier gas splits at a separation point 124 is positioned between a gas entry point 130 and inlet valves 116, 120. The flow of carrier gas into the vessel 104 at inlets 152, 156 can be controlled by opening and/or closing the inlet valves 116, 120. Fluid flow paths continue from the vessel inlets 152, 156 to their respective tray inlets 162, 166. The vessel inlets 152, 156 and the tray inlets 162, 166 can coincide in some embodiments. Each of the trays 108, 112 may define serpentine reactant beds and flow paths thereover, as will be better understood from the description of FIGS. 4-12 below.

As shown in FIG. 2A, the flow paths of the first tray 108 and of the second tray 112 are not in fluid communication within the vessel 104. In the illustrated configuration, the trays 108, 112 have respective tray outlets 172, 176 in fluid communication with respective vessel outlets 182, 186. In certain configurations, the tray outlets 172, 176 can coincide with the vessel outlets 182, 186. Fluid that passes through trays 108, 112 can exit the fluid configuration shown at exit points 140, which can lead to other flow control devices (e.g., valves) and the deposition chamber(s). The effluent from the vessel 104 includes carrier gas and reactant gas vaporized within the trays 108, 112. In some embodiments, the effluent from both trays can merge downstream of the illustrated exit points 140.

Inactive or inert gas is preferably used as the carrier gas for the vaporized precursor. The inert gas (e.g., nitrogen, argon, helium, etc.) may be fed into the SSCV vessel 104 through the entry point 130. In some embodiments, different inert gases may be used for various processes and in various systems described herein.

It will be appreciated that additional valves and/or other fluidic control elements may be included that are not shown. For example, in addition to inlet valves, each of the trays 108, 112 can be provided with separate outlet valves, as will be appreciated from the description of embodiments described with respect to FIGS. 4-12 below.

Figure 2B:
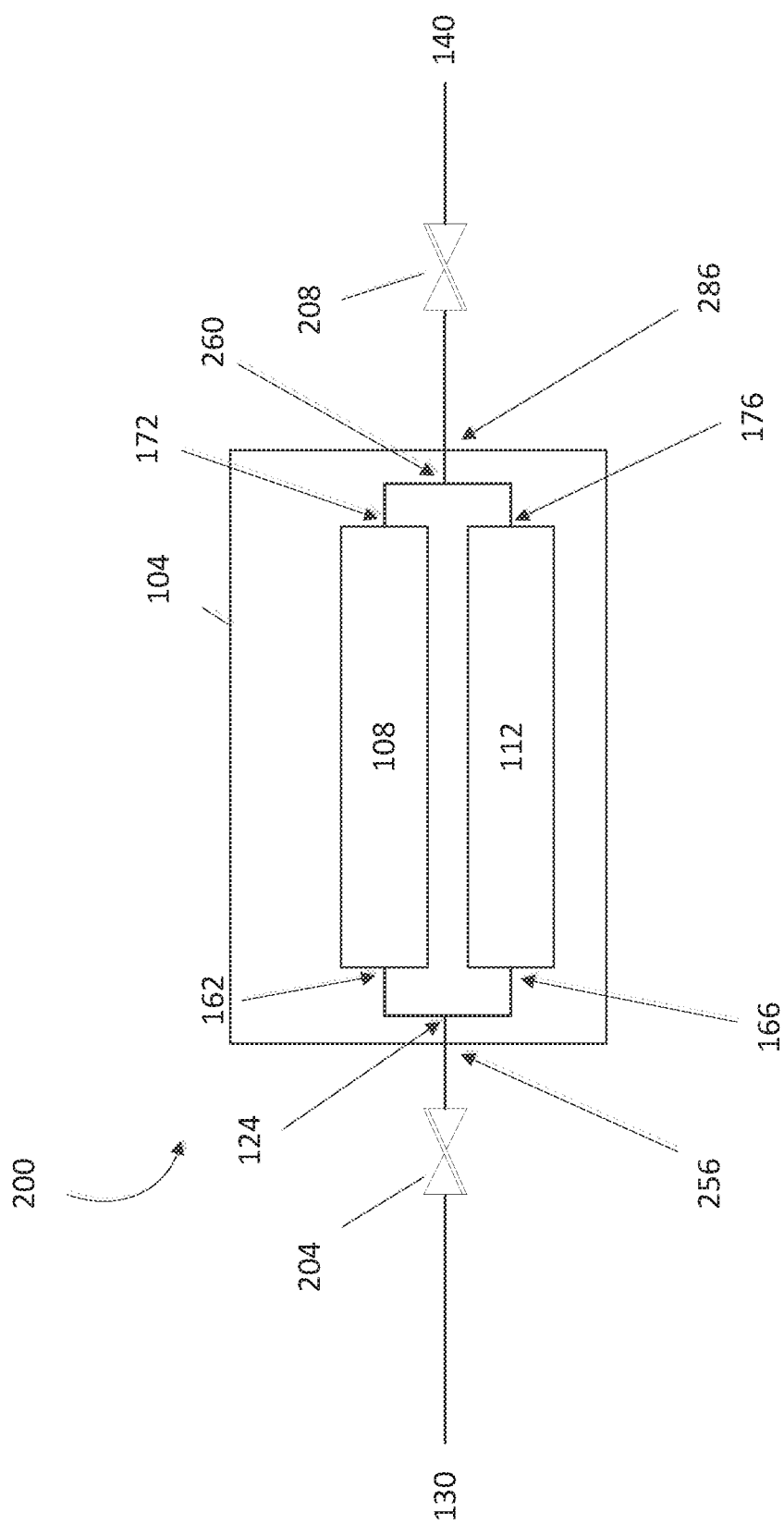
FIG. 2B shows a fluid configuration of the trays of the vessel such that the flow paths through the trays are arranged in parallel but may merge within the vessel.

FIG. 2B illustrates another embodiment in which the trays 108, 112 can be arranged in parallel. FIG. 2B differs from FIG. 2A in that the flow can split at the separation point 124 and merge at a merger point 260 within the SSCV vessel 104. In the illustrated embodiment, the separation point 124 is downstream of an inlet valve 204 and vessel inlet 256, while the merger point 260 is upstream of a vessel outlet 286 and outlet valve 208. In still other arrangements that combine features of FIGS. 2A and 2B, one of the separation point 124 and merger point 260 can be within the vessel 104, while the other is outside the vessel 104.

As will be appreciated by the skilled artisan, parallel flow arrangements through the trays 108, 112 as shown in FIGS. 2A and 2B enable high concentration doses to be delivered to the deposition chamber(s) without occupying the volume or footprint that multiple vapor sources would entail. As described in more detail below, each tray can include an elongated path, particularly a serpentine path, over solid reactant to enable contact of the carrier gas with a high surface area of solid reactant.

It will be appreciated that additional valves and/or other fluidic elements may be included that are not shown. For example, a three-way switching valve can be provided at the separation point 162 that can alternate the flow through the first tray 108 and the second tray 112. Such configurations can also allow the first tray 108 to continue vaporizing and collecting vapor above the solid source chemical bed(s) without removal thereof while carrier gas flows through and carries away reactant vapor in the second tray 112, and vice versa. Additionally, switching valves can be provided downstream of the SSCV vessel 104 to alternate flow from the vessel 104 to two or more reactors (for example, deposition chambers). Such additional switching valves can be applied to either of the parallel arrangements of FIGS. 2A and 2B.

In some embodiments, the trays 108, 112 can be arranged in series, as shown in FIG. 2C. In such a fluid configuration 200 the trays 108, 112 can receive gas from a common entry point 130 that feeds a common inlet valve 204. Carrier gas can enter the vessel at a vessel inlet 256. In certain embodiments, the gas passes through a first tray inlet 162 before passing into the first tray 108. After passing through the first tray 108, which may include a serpentine reactant bed and flow path, the gas can exit the first tray 108 at a first tray outlet 152 before entering the second tray 112, which may also include a serpentine reactant bed and flow path, at a second tray inlet 166. It will be understood that FIG. 2C is schematic and that the two trays 108, 112 may have various physical relations to each other within the SSCV vessel 104. In embodiments shown in FIGS. 4-12, low profile trays are vertically stacked within a single housing, and in such embodiments the first tray 108 can represent the upper or the lower tray.

As shown, in some embodiments the gas can exit the second tray 112 through a second tray outlet 176. The gas can pass from the vessel outlet 286 through the outlet valve 208 to an exit point 140. In some embodiments, the outlet valve 208 can be used to regulate the flow of fluid that passes to the exit point 140 and/or the flow of gas that passes through the vessel outlet 286.

It will be appreciated that additional valves and/or other fluidic elements may be included that are not shown. For example, one or more of the vessel inlet 256, the tray inlets 162, 166, the tray outlets, 172, 176, and vessel outlet 286 can be equipped with valves that are configured to regulate the flow of gas therethrough. Additional valves and other fluidic elements may be included that are not shown in certain configurations.

Figure 2D:
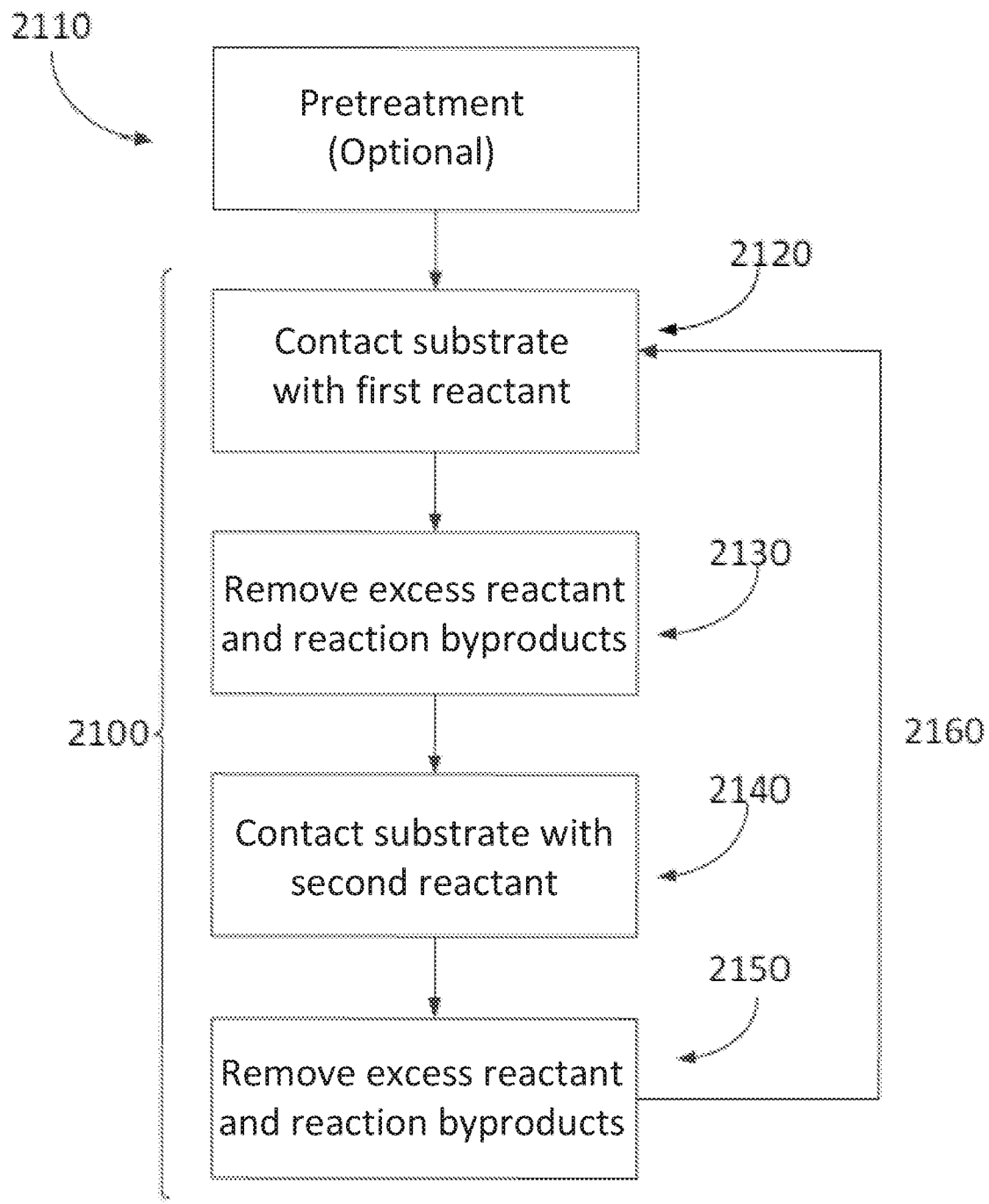
FIG. 2D illustrates an exemplary ALD process.

FIG. 2D illustrates an exemplary ALD process 2100. Some embodiments may include a pretreatment process at block 2110 applied to the substrate surface. A pretreatment may comprise one or more processes. In the pretreatment, the substrate surface on which a first reactant (e.g., comprising a metal) is to be deposited may be exposed to one or more pretreatment reactants and/or to specific conditions, such as temperature or pressure. A pretreatment may be used for any number of reasons, including to clean the substrate surface, remove impurities, remove native oxide, and provide desirable surface terminations to facilitate subsequent deposition reactions or adsorption. In some embodiments, a pretreatment comprises exposing the substrate surface to one or more pretreatment reactants, such as an oxidation source and/or cleaning reactant, such as $H_2O$, $O_3$, HCl, HBr, $Cl_2$, HF, plasma products, etc. In some embodiments, a pretreatment process comprises one or more exposures of the substrate of a suitable chemical, the exposures ranging from about 0.05 s to about 600 s, preferably from about 0.1 s to about 60 s. In some embodiments, the pressure during a pretreatment process is maintained between about 0.01 Torr and about 100 Torr, preferably from about 0.1 Torr to about 10 Torr. In some embodiments, multiple pretreatment reactants are used sequentially or simultaneously. In some embodiments, a pretreatment may involve multiple applications of one or more pretreatment reactants.

A pretreatment process may utilize pretreatment reactants in vapor form and or in liquid form. The pretreatment process may be performed at the same temperature and/or pressure as the subsequent ALD process; however, it may also be performed at a different temperature and/or pressure. For example, where an ex situ pretreatment involves the immersion of the substrate in an aqueous solution, it may be desirable to allow the pretreatment to proceed at a higher pressure than the ALD process, which may be performed at relatively low pressures that could undesirably evaporate the pretreatment reactant.

Referring again to FIG. 2D, the substrate is contacted with a first reactant at block 2120. Reactants may also be referred to as precursors where the reactant leaves element(s) in the film being deposited. In some embodiments with a stationary substrate (time divided ALD) the first reactant is conducted into a reaction chamber in the form of vapor phase pulse and contacted with the surface of the substrate. Where the first reactant is a precursor to be adsorbed, conditions can be selected such that no more than about one monolayer of the precursor is adsorbed on the substrate surface in a self-limiting manner. The first precursor pulse is supplied in gaseous form. The first precursor gas is considered "volatile" for purposes of the present description if the species exhibits sufficient vapor pressure under the process conditions to transport the species to the workpiece in sufficient concentration to saturate exposed surfaces.

In some embodiments the first precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. As the skilled artisan will appreciate, exposure time to ensure surface saturation will depend on reactor volume, size of the substrate, precursor concentration in the carrier gas, and process conditions.

The first precursor employed in the ALD type processes may be solid, liquid, or gaseous material under standard conditions (room temperature and atmospheric pressure), provided that the first precursor is in vapor phase before it is conducted into the reaction chamber and contacted with the substrate surface. In some embodiments, the first precursor may include a metal and may be a solid source material under standard conditions, such as in the form of a powder in the SSCV vessel 104 described herein.

At block 2130 excess first reactant and reaction byproducts, if any, are removed from the substrate surface, for example by supply of inert gas such as nitrogen or argon. Vapor phase precursors and/or vapor phase byproducts are removed from the substrate surface, for example by evacuating the chamber with a vacuum pump and/or by replacing the gas inside the reactor with an inert gas such as argon or nitrogen. Typical removal times are from about 0.05 to 20 seconds, more preferably between about 1 and 10 seconds, and still more preferably between about 1 and 2 seconds. However, other removal times can be utilized if necessary, such as when depositing layers over extremely high aspect ratio structures or other structures with complex surface morphology is needed. The appropriate removal times can be readily determined by the skilled artisan based on the particular circumstances.

In other embodiments, removing excess first reactant and reaction byproducts, if any, may comprise moving the substrate so that the first reactant no longer contacts the substrate. In some embodiments no reactant may be removed from the various parts of a chamber. In some embodiments the substrate is moved from a part of the chamber containing a first precursor to another part of the chamber containing a second reactant or no reactant at all. In some embodiments the substrate is moved from a first reaction chamber to a second, different reaction chamber. In such embodiments, the substrate may be moved, for example, through a zone or curtain of inert gas to aid removal, analogous to purging a chamber for a stationary substrate.

At block 2140 the substrate is contacted with a second reactant (e.g., precursor). In some embodiments, the second reactant comprises oxygen (e.g., water vapor, ozone, etc.).

In some embodiments the second precursor contacts the substrate for about 0.01 seconds to about 60 seconds, for about 0.02 seconds to about 30 seconds, for about 0.025 seconds to about 20 seconds, for about 0.05 seconds to about 5.0 seconds, about 0.05 seconds to about 2.0 seconds or about 0.1 seconds to about 1.0 second. However, depending on the reactor type, substrate type and its surface area, the second precursor contacting time may be even higher than 10 seconds. In some embodiments, particularly batch reactors with high volumes, contacting times can be on the order of minutes. The optimum contacting time can be readily determined by the skilled artisan based on the particular circumstances.

The concentration of the second precursor in the reaction chamber may be from about 0.01% by volume to about 99.0% by volume. And the second precursor may flow through the reaction chamber at a rate of between about 1 standard $cm^3/min$ and about 4000 standard $cm^3/min$ for typical single substrate reactors. The skilled artisan will appreciate that reaction conditions outside the above ranges may be suitable for certain types of reactors.

At block 2150, excess second reactant and gaseous by-products of the surface reaction, if any, are removed from the substrate surface, as described above for block 2130. In some embodiments excess reactant and reaction byproducts are preferably removed with the aid of an inert gas. The steps of contacting and removing may be optionally repeated at block 2160 until a thin film of the desired thickness has been formed on the substrate, with each cycle leaving no more than a molecular monolayer in a pure ALD process. However, the skilled artisan will appreciate that in some embodiments, more than a monolayer may be achieved by modifying conditions to be outside theoretical ALD conditions. For example, some amount of overlap between the mutually reactive reactants may be allowed to result in partial or hybrid CVD-type reactions. In some cases, it might be desirable to achieve at least partial decomposition of at least one the various precursors through selection of temperatures above the normal ALD window, by injection of energy through other means (e.g., plasma products), or condensation of multiple monolayers of the first reactant may be achieved by selection of temperatures below the normal ALD window for those reactants.

Various other modifications or additions to the process are possible. For example, more complicated cycles may include phases for additional precursors or other types of reactants (e.g., reducing agents, oxidizing agents, gettering agents, plasma or thermal treatments, etc.). Different cycles may be employed at selected relative frequency to tune compositions of the desired films. For example, silicon oxynitride may include 5 silicon oxide cycles for every 1 silicon nitride cycles, or any other desired ratio of cycles, depending upon the desired nitrogen content, and the ratios may change during the deposition if grading is desired in the layer composition. Additionally, because the process is cyclical, the "first" reactant may be supplied second without materially altering the process.

Figure 3:
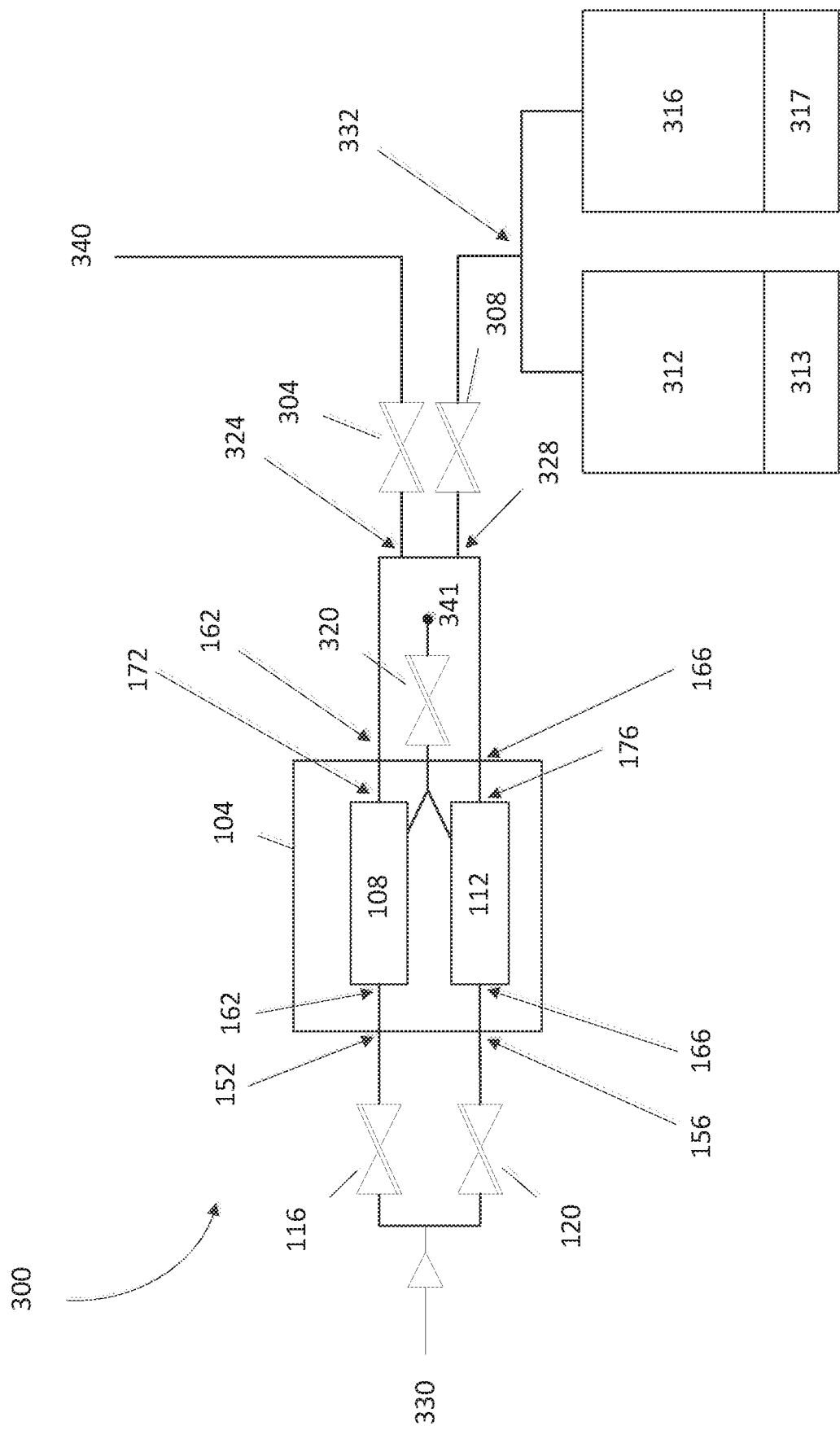
FIG. 3 schematically shows an example SSCV vessel that is fluidly connected to multiple deposition chambers.

With reference to FIG. 3, in some embodiments, the SSCV vessel 104 can be fluidly connected to one or more deposition chambers 312, 316. In some embodiments, the deposition chambers 312, 316 can be controlled using corresponding controllers 313, 317. In some embodiments, the controllers 313, 317 are associated with individual the deposition chambers (as shown). In some embodiments, the electronics and/or computer elements for use in controlling the deposition chambers 312, 316 can be found elsewhere in the system. For example, central controllers may control both apparatus of the chambers 312, 316 themselves as well as control the valves that connect to the SSCV vessel 104 and heaters associated with the SSCV vessel 104. One or more valves may be used to control the flow of gas throughout the multiple chamber deposition module 300. As shown in FIG. 3, a gas can flow from an entry point 330 into one or more inlet valves 116, 120.

In some circumstances, precursor source vessels are typically supplied with a head pressure of inert gas (e.g., helium) in the vessel when they are filled or recharged with precursor powder to minimize disturbance while moving the vessels. Before operation, it is desirable to vent this overpressure, but during such venting, solid precursor particles can become aerosolized and entrained in the inert gas outflow. This can contaminate the gas delivery system because such gas is typically vented out through the vessel's outlet isolation valve, the reactant gas delivery system, and ultimately the reactor's exhaust/scrubber. Later, during substrate processing, the contaminated portions of the gas panel that are common to the precursor delivery path and the vent path can cause processing defects during ALD on the substrate. In certain embodiments, a separate vent valve 320 can be used to fluidly connect to both of the trays 108, 112. In some cases the vent valve can be used to release pressure from one or more of the trays 108, 112. To achieve this, for example, inlet valves 116, 120 and outlet valves 304, 308 can be closed to facilitate the flow of gas through the vent valve 320 in some embodiments. The flow of gas can exit the system at an exit point 341. The exit point 341 can release the gas as waste.

With continued reference to FIG. 3, in some embodiments the module 300 can be configured to allow gas to flow through a first inlet valve 116 into vessel inlet 152. Similarly, the module 300 can be configured to facilitate gas flow through a second inlet valve 120 and through a second vessel inlet 156. Gas can pass from the vessel inlets 152, 156 into the respective trays 108, 112 through respective tray inlets 162, 166.

As shown in FIG. 3, in some embodiments, the gas can flow out of the trays 108, 112 via respective tray outlets 172, 176 and through respective vessel outlets 162, 166. In some embodiments, the trays 108, 112 can be in fluid communication at one or more connection points 324, 328. In some embodiments, one or more of the connection points 324, 328 can include one or more valves (not shown) that can facilitate gas through the appropriate gas lines. For example, a valve at the first connection point 324 can be closed to facilitate gas flow through a valve that is open at the second connection point 328.

In some variations, the module 300 can be configured to allow gas to flow through a first outlet valve 304. In some embodiments, the gas can continue to flow through to an exit point 340. The exit point 340 can lead, e.g., to a separate deposition chamber module or for analysis of the gas. Such an analysis may include monitoring the saturation levels, ratios of chemicals, or levels of impurities in the gas.

In some embodiments, the system 300 can be configured to allow gas to flow a second outlet valve 308 to a chamber separation point 332. In some embodiments, the chamber separation point 332 can include one or more valves such that the flow of gas into or more deposition chambers 312, 316 can be controlled. For example, in some configurations, a three-way valve at the chamber separation point 332 can be configured such that gas flows alternately or simultaneously to the deposition chambers 312, 316.

It will be appreciated that additional valves and/or other fluidic elements may be included that are not shown. For example, one or more of the vessel inlets 152, 156, the tray inlets 162, 166, the tray outlets, 172, 176 and vessel outlets 162, 166 can be equipped with valves that are configured to regulate the flow of gas therethrough. Additional valves and other fluidic elements may be included that are not shown, in certain configurations.

Figure 4:
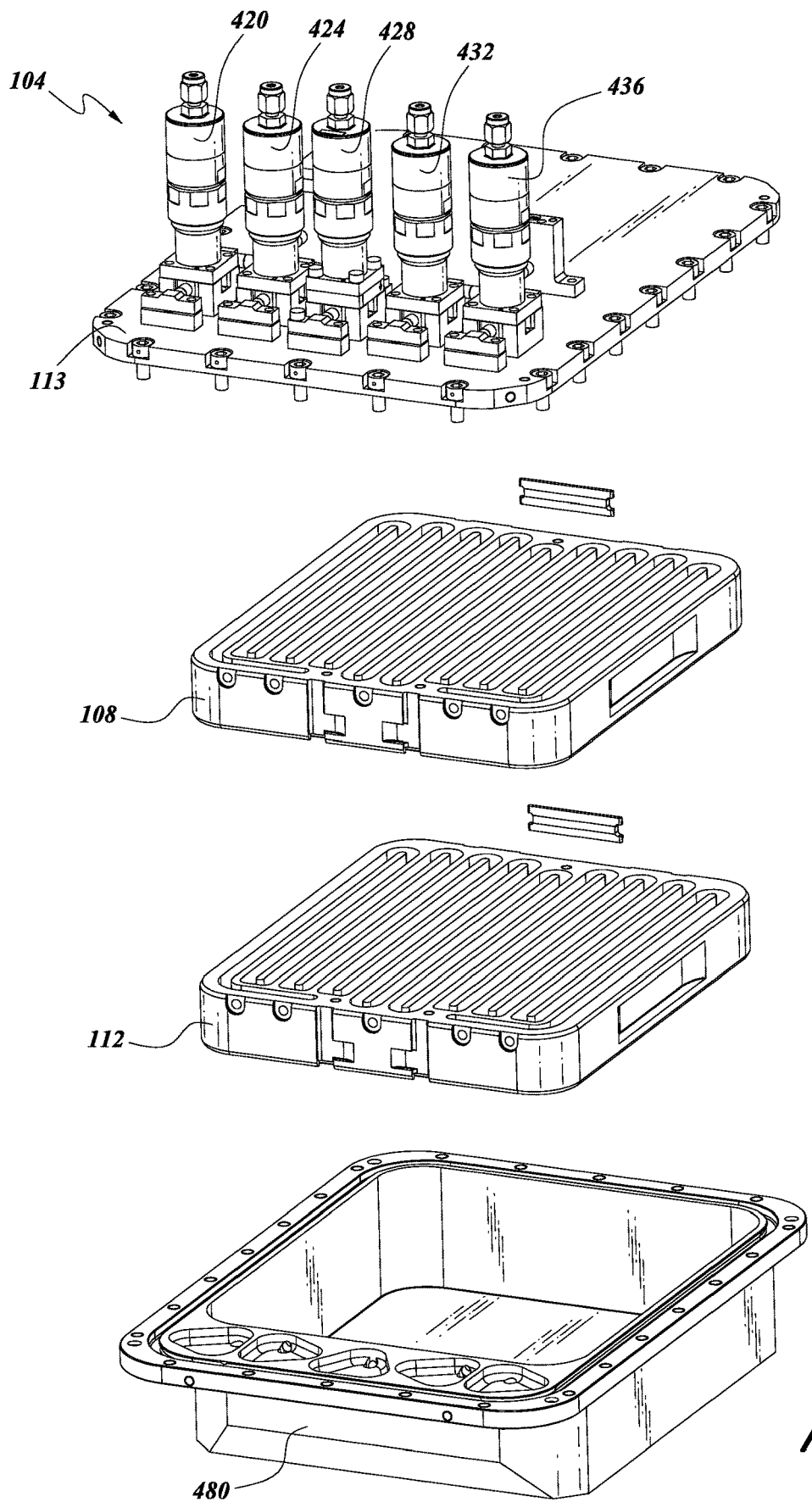
FIG. 4 is an exploded front, top and right isometric view of a housing lid, a housing base, and two internal reactant trays of a solid source chemical vessel, in accordance with an embodiment.

FIG. 4 illustrates an exploded view of some embodiments of the SSCV vessel 104. In some embodiments, the vessel 104 can include one or more valves 420, 424, 428, 432, 436. Certain configurations allow for a greater or fewer number of valves than are shown. In some embodiments, valves can be removably attached to the vessel 104. As illustrated, a first tray 108 and a second tray 112 can be housed or contained within a housing base 480. As shown, the first tray 108 can be vertically adjacent the second tray 112. In some embodiments, a housing lid 113 can be mechanically attached to the housing base 480. In some embodiments, the attachment can be achieved using one or more attachment devices (e.g., screws, bolts, etc.). In some embodiments, the housing lid 113 and housing base 480 are fluidly sealed such that gas substantially cannot enter and/or escape the vessel 104, except as described herein.

In some configurations, the housing lid 113 can comprise one or more inlet valves, 420, 424, one or more outlet valves 432, 436, and/or a vent valve 428. In some embodiments, these valves can be attached to, but can be separate from, the housing lid 113. In some embodiments, valves can be removably attached to the housing lid 113.

In some embodiments, one or more of the trays 108, 112 can comprise a metal, particularly stainless steel or aluminum. Similarly, in some embodiments, one or more of the housing lid 113 and/or housing base 480 can comprise a metal. The trays 108, 112, housing lid 113 and/or housing base 480 can each be monolithic metal parts in some embodiments.

Figure 5:
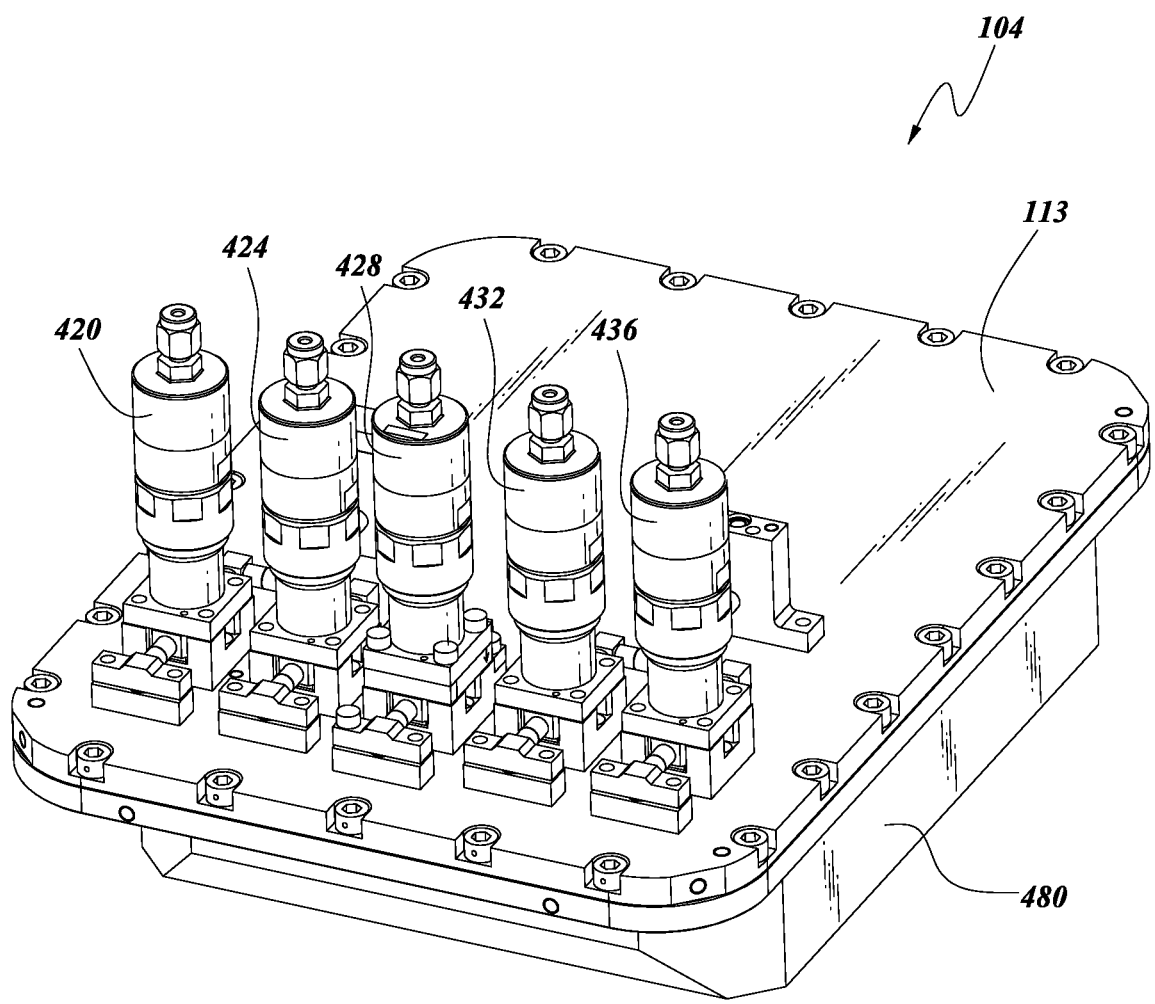
FIG. 5 is a front, top and right isometric view of the assembled vessel of FIG. 4.

FIG. 5 shows how the housing lid 113 and housing base 480 can be assembled to form the vessel 104 in certain embodiments. In some embodiments, the height of the assembly of the housing lid 113 and housing base 480 can be in the range of about 30 mm-750 mm. In some embodiments, the height of the assembly of the housing lid 113 and housing base 480 can be in the range of about 50 mm-100 mm, and is about 76 mm (about 3 inches) in the illustrated embodiment. In some embodiments, the length of the vessel 104 can be in the range of about 100 mm-635 mm. In some embodiments, the length of the vessel 104 can be in the range of about 200 mm-400 mm, and is about 305 mm (about 12 inches) in the illustrated embodiment. In some embodiments, the width of the vessel 104 can be in the range of about 100 mm-525 mm. In some embodiments, the width of the vessel 104 can be in the range of about 180 mm-360 mm, and is about 254 mm (about 10 inches) in the illustrated embodiment. In some embodiments, the vessel 104 can have a length:width aspect ratio in the range of about 1-3.5. In some embodiments, the vessel occupies a shape approximating a rectangular prism with rounded corners. In some embodiments, the mass of the vessel in various embodiments described herein can range from in the range of about 25 kg-110 kg. In some embodiments, the mass of the vessel can be in the range of about 35 kg-65 kg. Lower masses of vessels and/or trays allow for easier transportation, but higher masses can facilitate more uniform temperature distribution and a thermal flywheel effect to moderate fluctuations.

Figure 6A:
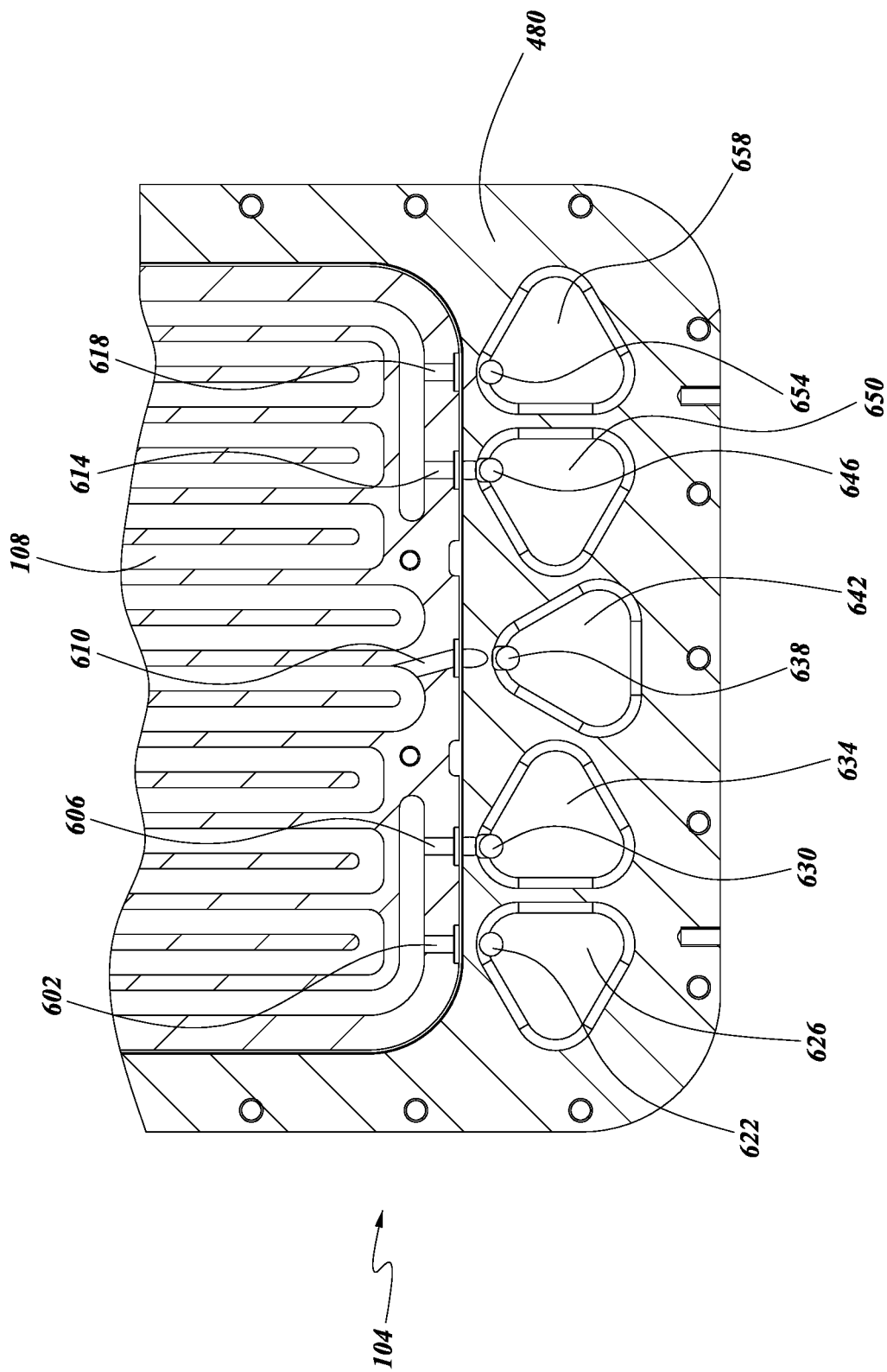
FIG. 6A is a partial top plan view of the base and top tray of FIG. 4, showing various porting recesses and other fluidic structures in various embodiments.

FIG. 6A illustrates a top view of various porting recesses and other fluidic structures in various embodiments. In some embodiments, one or more porting recesses 626, 634, 642, 650, 658 can be milled into the housing base 480. In certain configurations, the porting recesses 626, 634, 642, 650, 658 can be adapted to receive filters associated with corresponding valves 420, 424, 428, 432, 436, shown in FIG. 5, which may be mechanically attached to the housing base 480, as described herein. One or more vessel inlets 622, 630, vessel outlets 646, 654, and/or a vessel vent port 638 can be milled into the vessel housing 480. In some configurations, the vessel vent port 638 can be configured to be in fluid communication with the vent valve 428 (FIG. 5). In some embodiments, one or more trays 108, 112 can include one or more tray inlets 602, 606, one or more tray outlets 614, 618, and/or one or more tray vent channels 610.

In some configurations, each of the trays 108, 112 can be configured to include a separate tray vent channel 610. In some configurations, one or more tray vent channels 610 can be configured to permit gas flow into and/or out of the corresponding tray 108, 112. In certain embodiments, each of the one or more tray vent channels 610 can be in fluid communication with the vessel vent port 638, which in turn can be in fluid communication with the vent valve 428 (FIG. 5). In some embodiments, the tray inlets 602, 606 can be configured to be in fluid communication with corresponding vessel inlets 622, 630. Similarly, the tray outlets 614, 618 can be configured to be in fluid communication with corresponding vessel outlets 646, 654.

Figure 6B:
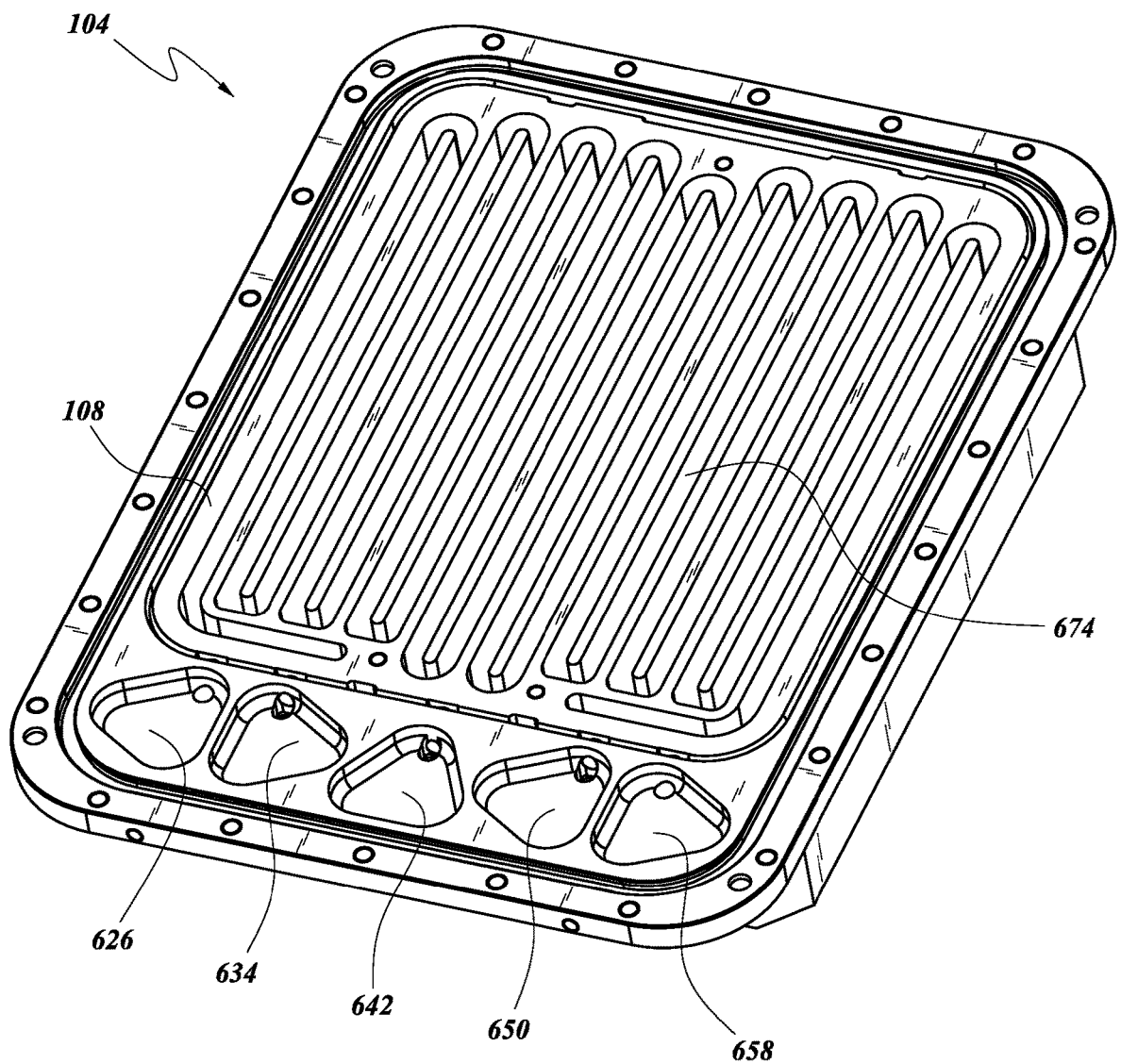
FIG. 6B is a top isometric view of the base and top tray various porting recesses and tray structure in certain embodiments.

FIG. 6B illustrates the SSCV vessel 104 with the lid removed. As shown, the porting recesses 626, 634, 642, 650, 658 can be configured as described above. The vessel 104 can include one or more trays, but in FIG. 6B only the upper tray 108 is visible. In some embodiments, the one or more trays can each define a corresponding serpentine path 674. Each serpentine path 674 can be adapted to hold solid source chemical and allow the flow of gas thereover. In some configurations, each serpentine path 674 can be milled and/or machined into the tray(s) 108, 112 (FIG. 4), or the tray can be molded to have the serpentine path 674. In some embodiments, the serpentine path(s) 674 can be milled out of a solid (e.g., cast) metal block.

In some embodiments, the serpentine path 674 can be in fluid communication with a corresponding tray inlet 602, 606, a corresponding tray outlet 614, 618, and/or a corresponding tray vent channel 610. Each serpentine path 674 can be in fluid communication with a corresponding inlet valve, 420, 424, a corresponding outlet valve 432, 436, and/or a vent valve 428 as discussed with respect to FIGS. 5 and 6A. The fluid configuration used to connect the serpentine path(s) 674 with one or more valves can be as described herein.

It will be appreciated that longer path lengths can increase a surface area of gas exposure of the solid source chemical. The serpentine path 674 for each tray 108, 112 can have a length in the range of about 2000 mm-8000 mm. In some embodiments, the serpentine path 674 can have a length in the range of about 3000 mm-5000 mm, and in the illustrated embodiment is about 3973 mm (156.4 inches). The total path length counting both trays 108, 112 can therefore be in the range of about 6000 mm-10000 mm, or about 7946 mm in the illustrate embodiment.

As will be appreciated by the skilled artisan, it may be advantageous to reduce the volume or footprint that multiple vapor sources would entail. Compact vessel assemblies can reduce such a footprint. In certain embodiments, each tray 108, 112 can have a height of between about 25 mm-50 mm. In certain configurations, each tray 108, 112 can have a height of between about 15 mm-30 mm. In some embodiments, each tray 108, 112 can have a height of between about 40 mm-80 mm. In some embodiments, a stack of trays can have a combined height of between about 50 mm-100 mm. In some embodiments, the stack of trays can have a combined height of between about 35 mm-60 mm. In some embodiments, a stack of trays can have a combined height of between about 85 mm-150 mm.

An ability to hold a large mass and/or volume of solid source chemical in the SSCV vessel can increase the time needed between recharging treatments. Moreover, this can allow for greater mass of sublimated solid source chemical in the same amount of time. Thus, in some embodiments the serpentine path(s) 674 can be adapted to hold in the range of about 750 g-2000 g of typical solid source chemical for vapor phase deposition, particularly inorganic solid source metal or semiconductor precursors, such as $HfCl_4$, $ZrCl_4$, $AlCl_3$, or $SiI_4$. In some embodiments the serpentine path(s) 674 can each be adapted to hold in the range of about 500 g-1200 g of solid source chemical. In some embodiments the two serpentine paths 674 of the SSCV vessel 105 can together be adapted to hold between about 1500 g-2000 g of solid source chemical. Longer path lengths and/or greater masses of solid source chemical that the trays can hold can lead to a greater amount of precursor to the deposition chambers in the same amount of time. In some cases, the longer path length and/or greater masses of solid source chemical can increase the amount of saturation that can be achieved in the same amount of time. In some embodiments, an elapsed time between two consecutive vapor processes (e.g., a pulse/purge length) can be between about 100 ms-3 s. In some embodiments, the elapsed time can be between about 30 ms-1.5 s.

The size of a vessel can be related to the amount of solid source chemical. For example, a ratio of a volume (in $mm^3$) enclosed by the vessel to the mass (in g) of solid source chemical it can hold can be in a range of about 2000-5000. In certain configurations, a ratio of the total path length (in mm) of all trays to a mass (in g) of the total amount of solid source chemical they can hold can be in a range of about 1-10. In some embodiments, a ratio of a volume (in $mm^3$) enclosed by the vessel to the total path length (in mm) of all trays can be in a range of about 400-1200. These ranges are determined in part by natural limitations placed on the vessel, the materials used, and space limitations.

Figure 7:
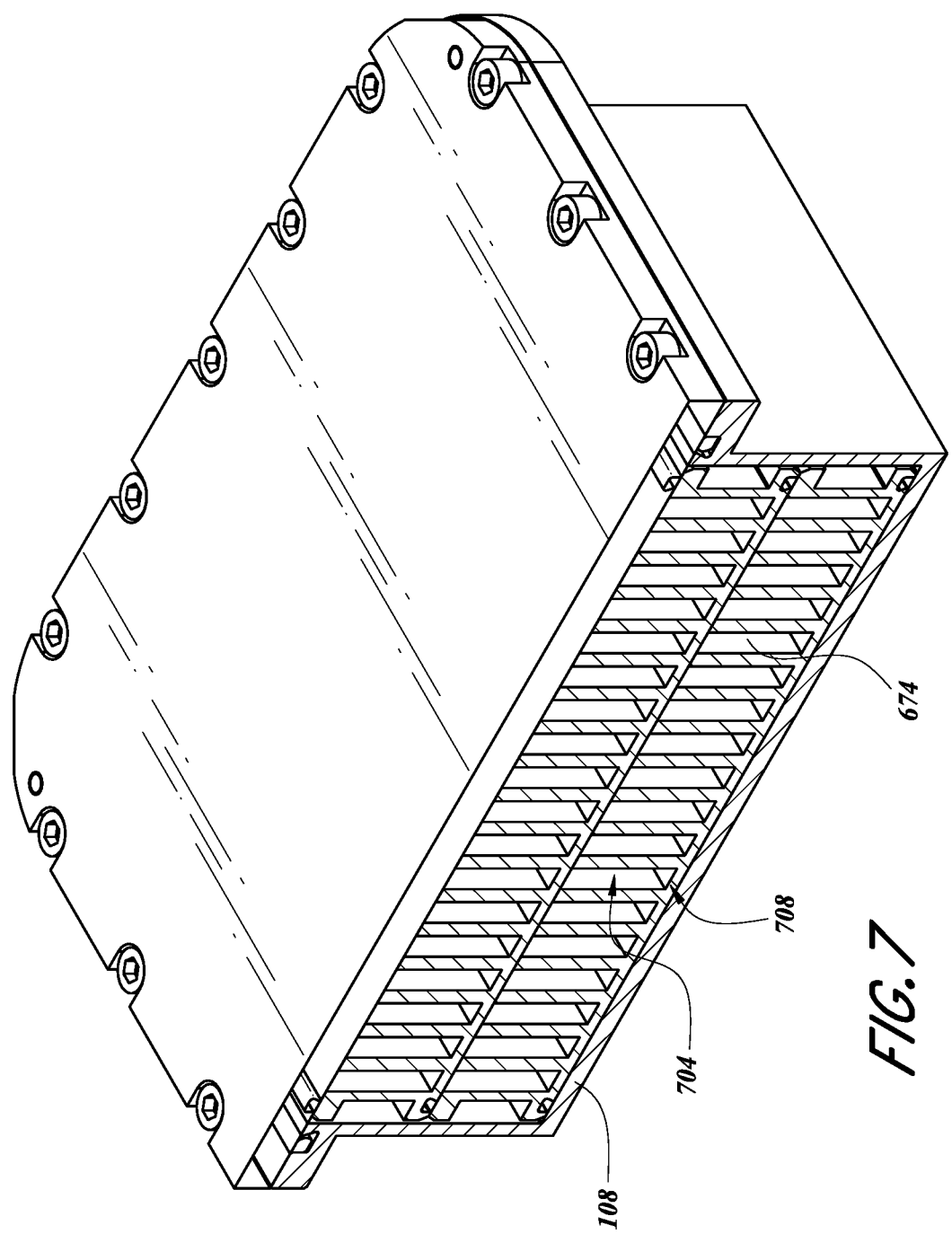
FIG. 7 is a cross-sectioned front, top and right isometric view of the top tray and lid of FIG. 4 in certain configurations.

FIG. 7 illustrates a cross-sectional side view of the first tray 108 in certain configurations, which can be similar to the second tray 112. The serpentine path 674 of the tray 108 can have a recess height 704 and a recess width 708. In some embodiments, the recess height 704 can be between about 10 mm-50 mm. In some embodiments, the recess height 704 can be between about 20 mm-40 mm. In some embodiments, the recess width 708 can be between about 3.0 mm-20 mm. In some embodiments, the recess width 708 can be between about 5 mm-8 mm. In some embodiments, the recess height 704 and recess width 708 can define a height: width aspect ratio of 3-7. In some embodiments, the recess height 704 and recess width 708 can define a height: width aspect ratio of between about 4.0-5.5. In the illustrated embodiment, the recess height is about 30 mm, the width is about 6.35 mm, and the ratio of height:width is about 4.7. As an example, about ⅔ of the height (e.g., around 19 mm to 22 mm) may be filled with solid precursor when initially filled, and the headroom above that fill height (e.g., around 8 mm to 11 mm) can be reserved as head space to facilitate collection of reactant vapor above the solid precursor, and allow carrier gas flow to pick up such vapor.

It may be advantageous to obtain increased mixing of the reactant with the carrier gas. In some embodiments, this is achieved by increasing the turbulence of the carrier gas within the flow paths. For example, some embodiments include structural features within one or more flow paths that create more turbulence compared to smooth gas flow paths and thus encourage mixing of the flowing carrier gas with the reactant vapor formed from vaporizing the solid reactant bed at the lower of the flow path(s) 674. In certain configurations, the structures can be protrusions that extend horizontally from the vertical side walls of the recesses that define the serpentine paths 674, particularly in the upper approximately ⅓ of the height reserved for inert gas flow when the lower ⅔ is filled with precursor. The middle ⅓ of the recess height may also include horizontal protrusions for additional turbulence when the bed of solid precursor is partially exhausted. The lower ⅓ of the recess can also include horizontal protrusions for better mixing when the solid precursor bed is almost exhausted but still in operations. The protrusions can include features directing carrier gas flow downwardly and/or upwardly to encourage to increase turbulence relative to smooth walls. Such protrusions can be adapted to promote vortices, such as, for example, horizontal slit arrays, hole arrays, and/or roll cells. The protrusions can be arranged horizontally or vertically. In some configurations, the combination of carrier gas flow rate and configuration of the structures for increasing turbulence can be tuned to increase mixing of carrier gas and reactant vapor without excessively stirring unevaporated reactant (e.g., powder) that can clog the filters. The carrier gas flow rates in some embodiments can range from about 500 sccm to 10 slm, preferably from about 1 slm to 3 slm. The size of any features described above within the flow path(s) may depend on the carrier gas flow rate.

Figure 8:
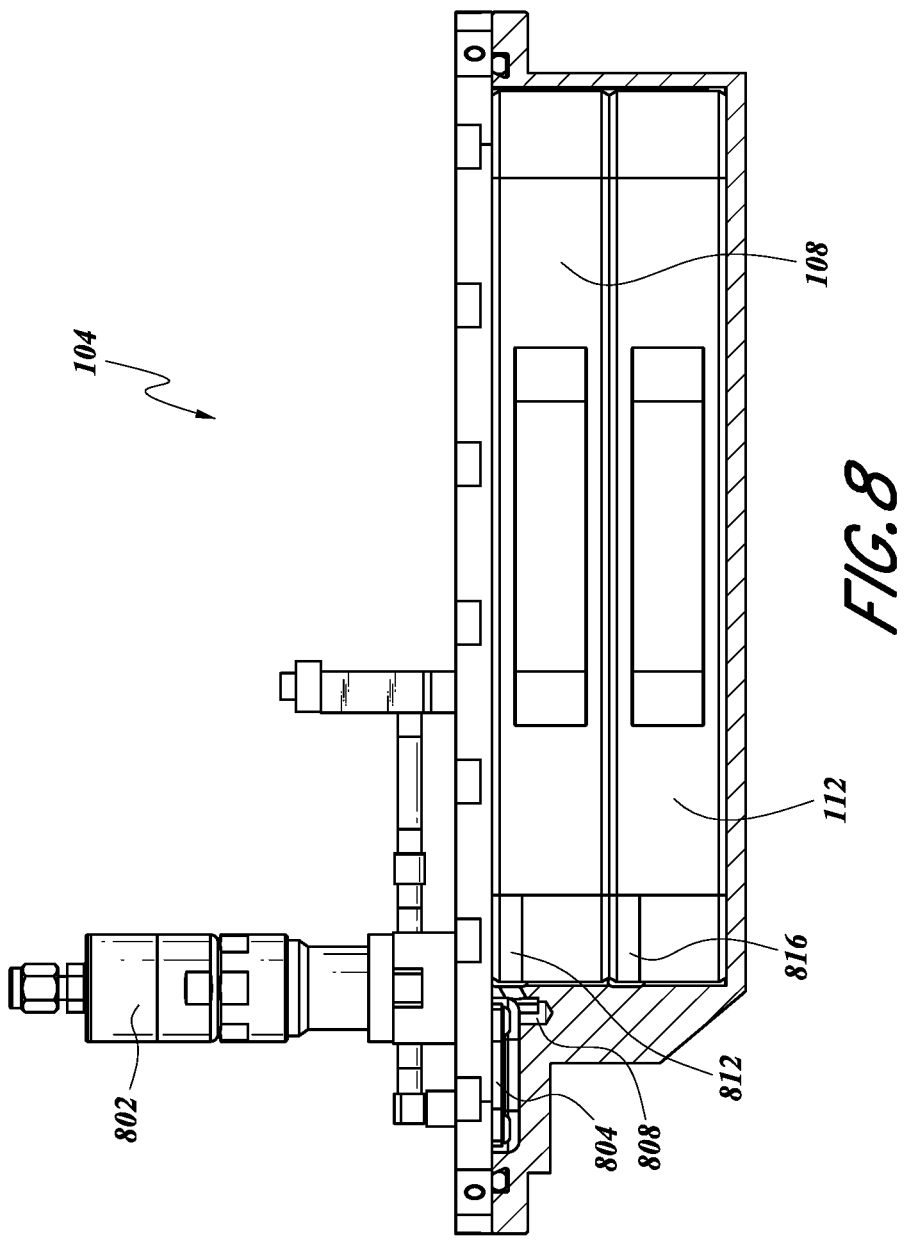
FIG. 8 is a cross-sectional side view of an example vessel through one of the valves configured to be in fluid communication with a first tray.

FIG. 8 illustrates a cross-sectional side view of an example vessel 104 where a valve 802 is configured to be in fluid communication with a first tray 108. The valve 802 of FIG. 8 may represent an inlet valve or an outlet valve for communication with the first tray 108. A filter 804 is adapted to prevent solid particulate matter from flowing therethrough. The filter material is configured to restrict the passage of particles greater than a certain size, for example about 0.003 μm. The material can comprise any of a variety of different materials, such as nickel fiber media, stainless steel, ceramics (e.g., alumina), quartz, or other materials typically incorporated in gas or liquid filters.

As shown in FIG. 8, a vessel inlet/outlet 808 can be in fluid communication with a tray inlet 812. Thus, via the tray inlet 812, the vessel inlet/outlet 808 can be in fluid communication with the first tray 108, in certain embodiments. In certain configurations, the tray inlet/outlet 812 can correspond to one or more of the tray inlets or tray outlets 602, 606, 614, 618 as described herein with respect to FIGS. 4-6B. Similarly, the vessel inlet/outlet 808 can correspond to one or more of the vessel inlets or vessel outlets 622, 360, 646, 654, as described herein with respect to FIGS. 4-6B.

The valve 802 may represent one or more of the inlet valves and outlet valves 420, 424, 432, 436 as described herein with respect to FIGS. 4-6B.

Figure 9:
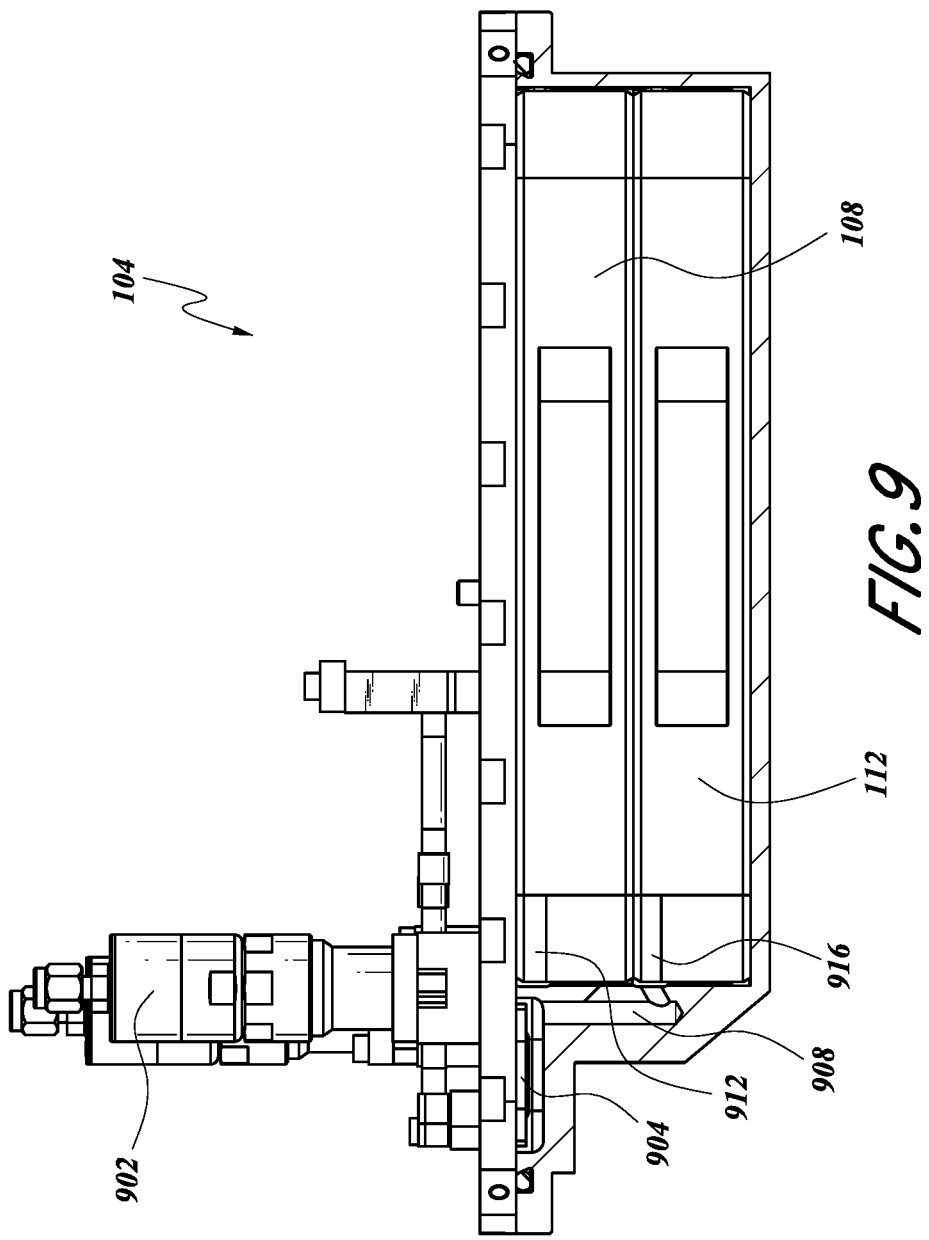
FIG. 9 is a cross-sectional side view of an example vessel through one of the valves configured to be in fluid communication with a second tray.

FIG. 9 illustrates a cross-sectional side view of an example vessel 104 where a valve 902 is configured to be in fluid communication with a second tray 112. The valve 802 of FIG. 8 may represent an inlet valve or an outlet valve for communication with the second tray 112. A filter 904 can be similar to that described above. As shown, a vessel inlet/outlet point 908 can be in fluid communication with a tray inlet/outlet 912. Thus, via the tray inlet/outlet 912, the vessel inlet/outlet 908 can be in fluid communication with the second tray 112, in certain embodiments. In certain configurations, the tray inlet/outlet 912 can correspond to any of the tray inlets or tray outlets 602, 606, 614, 618 as described herein with respect to FIGS. 4-6B. Similarly, the vessel inlet/outlet 908 can correspond to any of the vessel inlets or vessel outlets 622, 360, 646, 654, as described herein with respect to FIGS. 4-6B. The valve 902 may represent any of the inlet valves or outlet valves 420, 424, 432, 436 as described herein with respect to FIGS. 4-6B.

Figure 10:
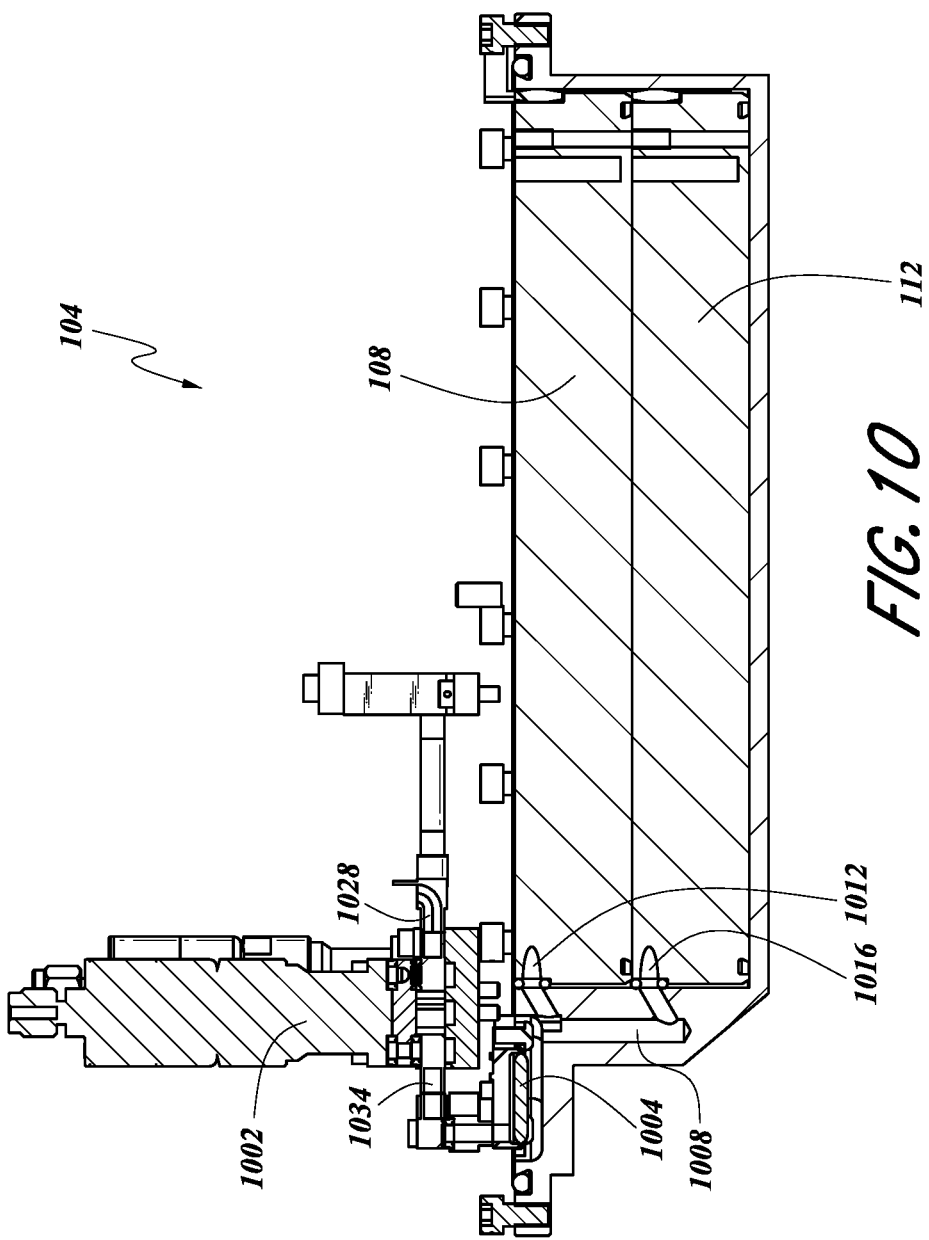
FIG. 10 is a cross-sectional side view of an example vessel through a vent valve configured to be in fluid communication with a first tray and a second tray.

FIG. 10 illustrates a cross-sectional side view of some embodiments of a vessel 104 where a valve 1002 is configured to be in fluid communication with both the first tray 108 and the second tray 112. In one embodiment, the valve 1002 of FIG. 10 may represent the vent valve 428 (FIG. 5) for venting inert gas overpressure that is provided with recharged vessels for movement with minimal disturbance of the solid precursor. As shown, a gas can selectively pass through piping 1034, the valve 1002 and piping 1028. In an embodiment where the valve 1002 is a vent valve, the piping 1028 can lead directly or indirectly to vent or a vacuum pump. The vessel can be configured to permit a gas to pass through a filter 1004. As shown, a vessel inlet/outlet 1008 can be in fluid communication with both a first tray inlet/outlet 1012 and a second tray inlet/outlet 1016. Thus, in some embodiments, via the first tray inlet/outlet 1012 and/or the second tray inlet/outlet 1016, the vessel inlet/outlet 1008 can be in fluid communication with the respective first tray 108 and/or second tray 112. In some embodiments, the filter 1004 can share one or more properties of the filter 804 as discussed above. In certain configurations, one or more of the tray inlets/outlets 1012, 1016 can correspond to the tray vent channels 610, as described above with respect to FIG. 6A. Similarly, the vessel inlet/outlet 1008 can correspond to one or more of the vessel vent port(s) 638, as described above with respect to FIG. 6A. The valve 1002 may represent the vent valve 428 as described above.

FIG. 1 shows an example of how a solid source chemical vaporizer (SSCV) vessel can be incorporated into a solid source assembly 1350. A solid source assembly 1350 can include the SSCV vessel 104, which can include the housing lid 113 and housing base 480 as described above. In some embodiments, a solid source assembly 1350 can include one or more heating elements 1102, 1106, 1110. In some embodiments, one or more of the heating elements can serve as a first vessel heater 1102 and be disposed vertically adjacent or vertically proximate the SSCV vessel 104. In some embodiments, the first vessel heater 1102 is configured to heat the vessel 104 by conduction. In certain embodiments, the first vessel heater 1102 is a heater plate that is disposed below the housing of the SSCV vessel 104. In certain embodiments, a second vessel heater 1110 can be disposed above the housing lid 113. In some embodiments, the second vessel heater 1110 is disposed above one or more valves 420, 424, 428, 432, 436 and is configured to radiantly heat one or more valves and the SSCV vessel 104 in the solid source assembly 1350. In certain configurations, a valve plate heater 1106 can be disposed above a valve plate 1112, which supports valves for distribution of vapors received from the SSCV vessel 104. In some embodiments, one or more hot feed throughs can be included in the walls of the solid source assembly 1350 to provide a heated path for gas to leave the solid source assembly 1350. The cabinet of the solid source assembly 1350 maybe be gas tight to allow pumping down to low pressures, such as between about 0.1 Torr and 20 Torr, e.g., about 5 Torr, and thus facilitate efficient radiant heating minimal conductive or convective losses to the atmosphere within the cabinet.

In some embodiments, the first vessel heater 1102 and the second vessel heater 1110 are adapted to heat the vessel housing (lid 113 and base 408) to an operating temperature. In some embodiments, the operating temperature is in the range of about 50° C.-250° C. The selected operating temperature may depend, of course, upon the chemical to be vaporized. For example, the operating temperature may be about 160° C.-240° C., particularly about 170° C.-190° C. for $HfCl_4$; about 170° C.-250° C., particularly about 180° C.-200° C. for $ZrCl_4$; about 90° C.-110° C. for $Al_2Cl_3$; about 90° C.-120° C. for $SiI_4$. The skilled artisan will readily appreciate other temperatures may be selected for other source chemicals. In certain embodiments, the valve plate 1112 is adapted to be heated to a temperature in the range of about 110° C.-240° C. In some embodiments, the one or more deposition chambers 312, 316 are adapted to be heated to a temperature in the range of about 160° C.-280° C. for HfO and ZrO deposition processes. The temperatures may be kept higher at the valve plate 1112 and the deposition chambers 312, 316 (FIG. 12), compared to the temperature of the SSCV vessel 104, to minimize risk of condensation upstream of the substrate in the deposition chambers 312, 316, while still remaining below decomposition temperatures.

Figure 12:
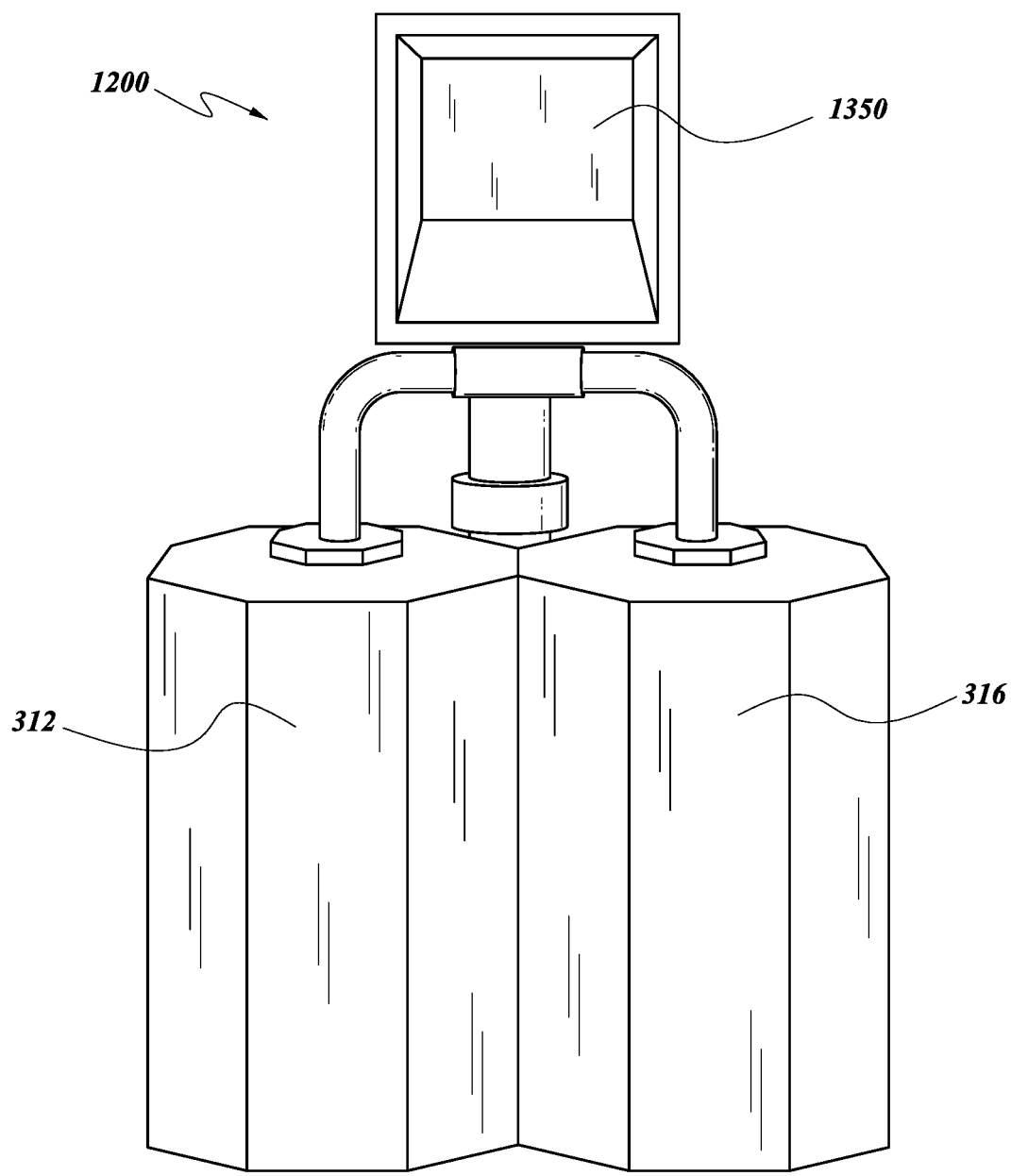
FIG. 12 is a front elevational view of a multi-chamber deposition module incorporating the solid source assembly of FIG. 11, in accordance an embodiment.

FIG. 12 shows a diagram of some embodiments of a multi-chamber deposition module 1200. In some embodiments, a solid source assembly 1350 can house a SSCV vessel (not shown), which may be heated within the solid source assembly 1350 as discussed above to vaporize solid chemical source and deliver vapor reactant alternately or simultaneously to the deposition chamber 312 and 316. FIG. 12 illustrates how the solid source assembly 1350, despite incorporating a relatively large footprint SSCV vessel (e.g., 450 mm lateral dimension), fits within the footprint and vertical headroom of a dual chamber module, and yet delivers higher mass flow of vaporized reactant than prior vessels.

Figure 13:
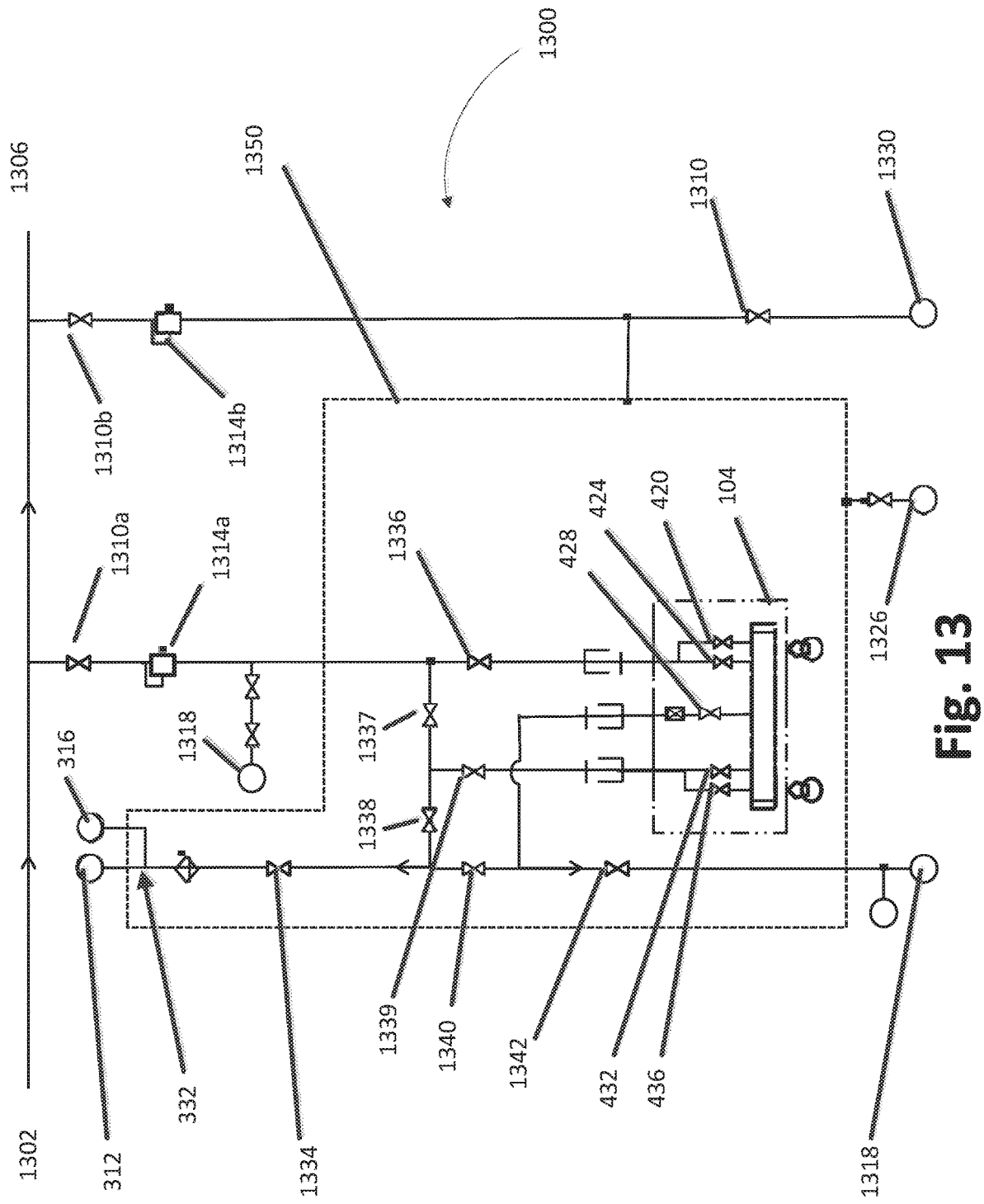
FIG. 13 illustrates a schematic fluid-flow diagram of an example multiple chamber deposition module.

FIG. 13 illustrates a schematic fluid-flow diagram of an example multiple chamber deposition module 1300, similar to that of FIG. 12. A flow of an inert gas (e.g., nitrogen) can enter the module 1300 at an entry point 1302. In some embodiments, the flow of gas can be controlled using valves 1310a, 1310b. If the gas is directed through the valve 1310a, it can pass through a downstream pressure controller 1314a, which can modulate the pressure in conjunction with control valves leading to a vacuum pump 1318. Inert gas flow can enter the solid source assembly 1350 and be further controlled by valves 1336, 1337. The flow of gas can be controlled so as to allow gas flow through the valve 1336 and into the solid source chemical vaporizer (SSCV) vessel 104. In some embodiments, gas can flow into one or more of inlet valves 420, 424 and into one or more corresponding trays (not shown) in the housing. After flowing through the serpentine flow paths above solid reactant beds and picking up reactant vapor, carrier gas flow can continue out of the housing via one or more outlet valves 432, 436. One or more valves 1338, 1339, 1334 can control the flow of the reactant vapor en route to the deposition chambers 312, 316. Additional valves 1340, 1342 can control flow from the system to vent or vacuum. In some embodiments, the valve 1334 can control whether the gas flow continues through a separation point 332 and into one or more deposition chambers 312, 316. In some embodiments, the separation point 332 can include one or more valves to further manage the flow of gas into the one or more deposition chambers. The deposition chambers 312, 316 can be fed gas using respective showerheads (not shown) for each chamber. A plurality of the valves 1336-1342 may be mounted on the separately heated valve plate 1112 (FIG. 11) over the SSCV vessel 104 and within the solid source assembly 1350, as explained above.

In some cases, gas flow may be directed to vent or vacuum through valves 1340, 1342. For example, such flow may be established to vent prior to stabilizing the flow and sending the flow to the reaction chambers In some embodiments, a vacuum pump 1318 can be used to create a vacuum pressure in order to help drive the flow of gas. In some embodiments, the vent valve 428 can also be in fluid communication with the vent or vacuum through the valve 1342; with one or more trays in the housing base 480 such that gas can be removed therefrom via the vent valve 428.

In some variations, the module 1300 can be configured to allow gas to flow through the valve 1310b and a downstream pressure controller 1314b, which can regulate pressure within the solid source assembly 1350 when the valve 1310 is open to the vacuum pump 1330 Inert gas can be vented to the vacuum pump 1330, e.g. when removing the SSCV vessel 104 for recharging with solid source chemical. In certain embodiments, a pressure relief valve 1326 can be used to relieve pressure from the solid source chamber 1350 if the internal pressure exceeds a threshold pressure (e.g., 1.5 psig) when the chamber is backfilled to atmospheric pressure, e.g., for maintenance or for replacing an exhausted SSCV vessel 104 with a recharged vessel. Maintaining low pressures (e.g., 0.1 Torr to 20 Torr, particularly about 5 Torr) within the solid source assembly 1350 during operation can facilitate radiant heating with minimal conductive/convective losses to the air or gas surrounding the heated components. An exit point 1306 can be arranged to supply inert gas to other systems (e.g., to the deposition chamber for purging or as a carrier gas to other chemical sources).

Figure 11:
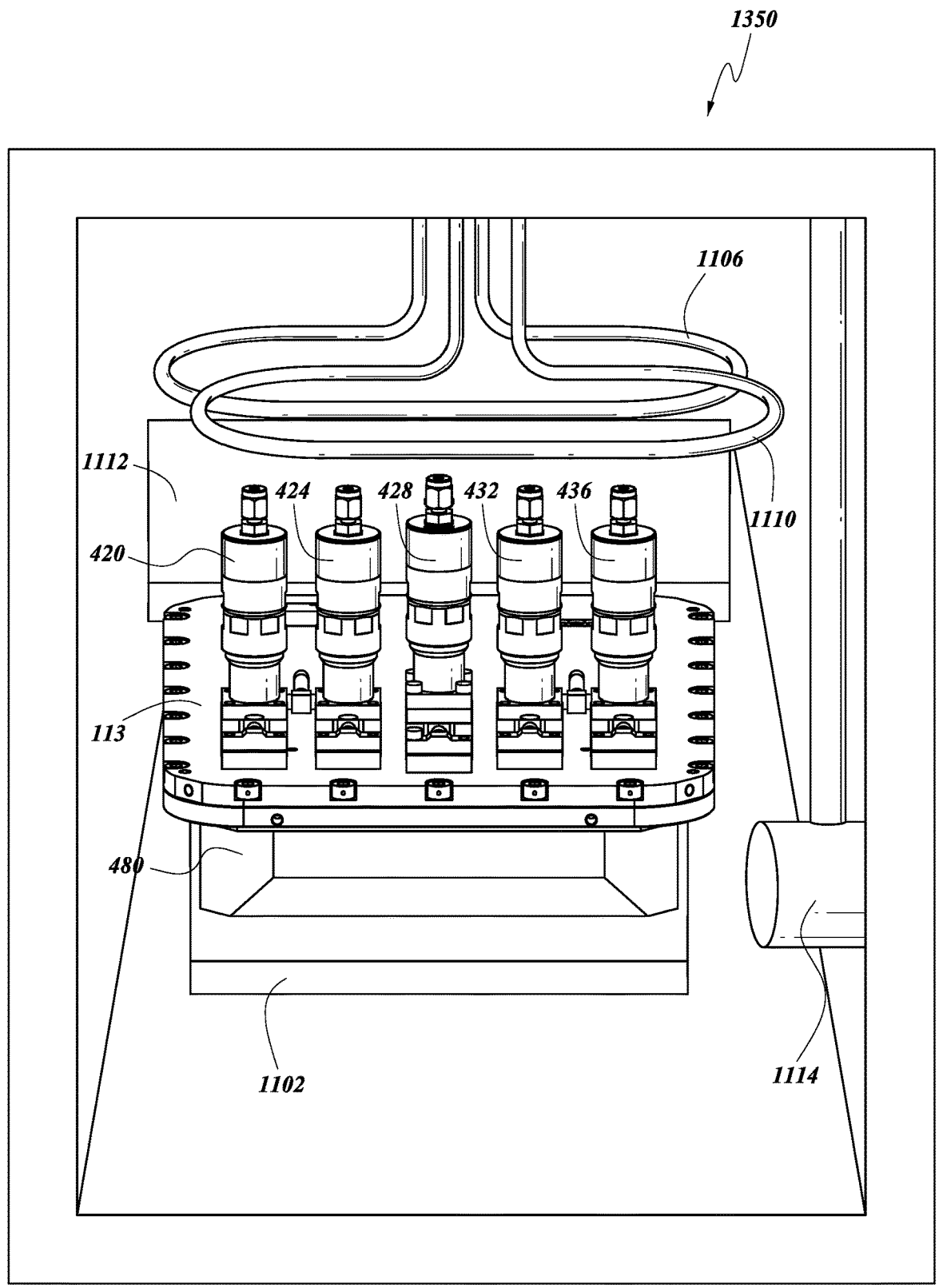
FIG. 11 is a front, top and left isometric view of a solid source assembly incorporating the solid source chemical vessel of FIG. 4.
Figure 14:
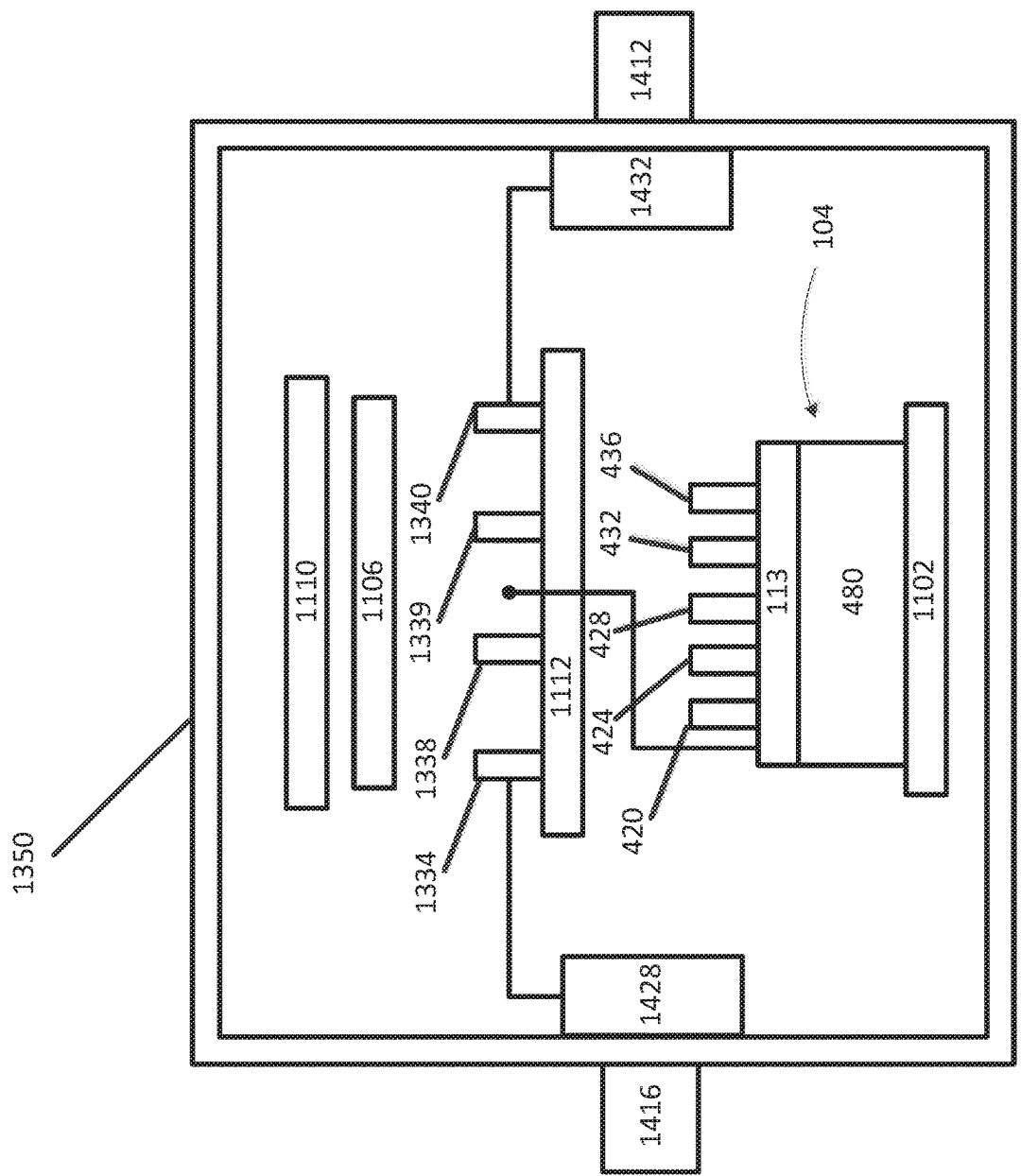
FIG. 14 schematically illustrates a solid source assembly in accordance with some embodiments.

FIG. 14 schematically illustrates the solid source assembly 1350 of FIG. 11. In some embodiments, the valve plate heater 1106 is configured to heat the valve plate 1112 and associated valves 1334, 1338, 1339, 1340. In some embodiments, the valve plate heater 1106 is configured and positioned to heat the valve plate 1112 using radiant heat. In some embodiments, the vessel heater 1110 is configured to heat a solid source chemical vaporizer (SSCV) vessel 104 and its associated valves 420, 424, 428, 432, 436. In some embodiments, the second vessel heater 1110 is configured to heat the SSCV vessel 104 using radiant heat. In some embodiments, first vessel heater 1102 can be disposed below the housing base 480. In some configurations, the first vessel heater 1102 is configured to heat the housing base 480 by conduction.

With continued reference to FIG. 14, gas can flow from the SSCV vessel 104 to the valve plate 1112 as shown. In some embodiments, the gas can be directed to one or more hot feed throughs 1412, 1416 via feed ports 1428, 1432. Some embodiments are configured such that gas flow can be directed from the one or more hot feed throughs 1412, 1416 to one or more deposition chambers (not shown).

In some embodiments, the solid source assembly (as disclosed herein) can operate at a target vacuum pressure. In some embodiments, the target vacuum pressure can be in the range of about 0.5 Torr-20 Torr, such as 5 Torr. In certain embodiments, the vacuum pressure in the solid source assembly can be regulated using one or more pressure controllers.

In some embodiments, the vent valve 428 can be used to vent off pressurized inert gas from one or more trays and/or one or more valves in the systems and/or methods described herein.

In a typical SSCV arrangement, carrier gas flows through the SSCV vessel 104 (e.g., above the solid chemical bed in the serpentine path 674). However, in other embodiments, a precursor vapor can be drawn out of the vessel by an external gas flow that creates a lower pressure outside of the vessel, as in a Venturi effect. For example, the precursor vapor can be drawn by flowing a carrier gas toward the one or more deposition chambers 312, 316 along a path downstream of the vessel. Under some conditions, this can create a pressure differential between the vessel and the flow path of the carrier gas. This pressure differential causes the precursor vapor within the SSCV vessel 104 to flow toward the one or more reaction chambers 312, 316.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Accordingly, the claims are not intended to be limited to the embodiments shown herein, but are to be accorded the widest scope consistent with this disclosure, the principles and the novel features disclosed herein. For example, although many examples within this disclosure are provided with respect to supplying vapor from solid sources for feeding deposition chambers for semiconductor fabrication, certain embodiments described herein may be implemented for a wide variety of other applications and/or in numerous other contexts.

What is claimed is:
1. A solid source chemical vaporizer, comprising:
   a housing base;
   a first tray configured to be housed within the housing base, the first tray defining a first serpentine path adapted to hold solid source chemical and allow gas flow thereover, the first serpentine path comprising a plurality of antiparallel segments within a first plane;
   a second tray configured to be housed within the housing base vertically adjacent the first tray, the second tray defining a second serpentine path adapted to hold solid source chemical and allow gas flow thereover, the second serpentine path comprising a plurality of antiparallel segments within a second plane, wherein the first serpentine path and the second serpentine path are configured to be switchably arranged between series and parallel arrangements; and
   a housing lid comprising:
      a first inlet valve mounted on the lid and in fluid communication with the first serpentine path;

a first outlet valve mounted on the lid and in fluid communication with the first serpentine path;
a second inlet valve mounted on the lid and in fluid communication with the second serpentine path; and
a second outlet valve mounted on the lid and in fluid communication with the second serpentine path.

2. The solid source chemical vaporizer of claim 1, wherein the first serpentine path and the second serpentine path are fluidly connected in series.

3. The solid source chemical vaporizer of claim 1, wherein the first serpentine path and the second serpentine path are fluidly connected in parallel.

4. The solid source chemical vaporizer of claim 1, wherein the first serpentine path and the second serpentine path are not in fluid communication with each other within the solid source chemical vaporizer.

5. The solid source chemical vaporizer of claim 1, wherein the first and second serpentine paths each comprise a recess formed in a solid metal block.

6. The solid source chemical vaporizer of claim 5, wherein the recess of the first serpentine path defines a height:width aspect ratio in a range of about 1.5-5.

7. The solid source chemical vaporizer of claim 1, wherein the housing lid further comprises a vent valve mounted on the lid and in fluid communication with each of the first and second serpentine paths.

8. The solid source chemical vaporizer of claim 1, wherein the first serpentine path has a length in a range of about 2000 mm 8000 mm.

9. The solid source chemical vaporizer of claim 1, wherein a combined height of the first tray and the second tray is between about 50 mm-100 mm.

10. A solid source chemical vaporizer, comprising:
a housing base;
a first tray configured to be housed within the housing base, the first tray defining a first path adapted to hold solid source chemical and allow gas flow thereover;
a second tray configured to be housed within the housing base vertically adjacent the first tray, the second tray defining a second path adapted to hold solid source chemical and allow gas flow thereover, wherein the first path and the second path are configured to be switchably arranged between series and parallel arrangements;
a housing lid;
a first inlet valve mounted on the housing lid and in fluid communication with the first path;
a first outlet valve mounted on the housing lid and in fluid communication with the first path;
a second inlet valve mounted on the housing lid and in fluid communication with the second path; and
a second outlet valve mounted on the housing lid and in fluid communication with the second path.

11. The solid source chemical vaporizer of claim 10, wherein the housing lid further comprises a vent valve mounted on the lid and in fluid communication with each of the first and second paths.

12. The solid source chemical vaporizer of claim 10, wherein the solid source chemical vaporizer defines a length:width aspect ratio in a range of about 1-3.5.

13. The solid source chemical vaporizer of claim 10, wherein the solid source chemical vaporizer defines a ratio of a volume (in $mm^3$) enclosed by the solid source chemical vaporizer to a total path length (in mm) of the first and second paths in a range of about 400-1200.

14. A multiple chamber deposition module, the multiple chamber deposition module comprising:
a first vapor phase reaction chamber for depositing a first material on a first substrate;
a second vapor phase reaction chamber for depositing a second material on a second substrate; and
a solid source chemical vaporizer connected to supply each of the first and second vapor phase reaction chambers with the respective first and second materials disposed within respective first and second paths, wherein the first path and the second path are configured to be switchably arranged between series and parallel arrangements, the solid source chemical vaporizer comprising:
a housing base;
a housing lid;
a first inlet valve mounted on the housing lid and in fluid communication with the first vapor phase reaction chamber;
a first outlet valve mounted on the housing lid and in fluid communication with the first vapor phase reaction chamber;
a second inlet valve mounted on the housing lid and in fluid communication with the second vapor phase reaction chamber; and
a second outlet valve mounted on the housing lid and in fluid communication with the second vapor phase reaction chamber.

15. The multiple chamber deposition module of claim 14, wherein the solid source chemical vaporizer comprises:
a first tray defining a first serpentine path, the first serpentine path adapted to hold solid source chemical and allow gas flow thereover; and
a second tray defining a second serpentine path, the second serpentine path adapted to hold solid source chemical and allow gas flow thereover,
wherein the first and second trays are in a stacked configuration.

16. The multiple chamber deposition module of claim 15, wherein the solid source chemical vaporizer further comprises:
a vent valve mounted and in fluid communication with each of the first and second serpentine paths.

17. The multiple chamber deposition module of claim 16, wherein the multiple chamber deposition module further comprises:
a connection point, wherein the first outlet valve and the second outlet valve are in fluid communication at the connection point;
a separation point configurable such that a carrier gas that passes through the separation point can selectively pass into the first vapor phase reaction chamber and/or the second vapor phase reaction chamber; and
a first gas panel valve fluidly interposed between the connection point and the separation point.

18. The multiple chamber deposition module of claim 17, further comprising a first filter on the housing lid or in a wall of the housing base, the first filter adapted to prevent solid particulate matter from flowing therethrough.

19. The multiple chamber deposition module of claim 17, further comprising a heater plate vertically adjacent the solid source chemical vaporizer.

* * * * *